United States Patent

Kawashima et al.

(10) Patent No.: US 7,619,716 B2
(45) Date of Patent: Nov. 17, 2009

(54) EXPOSURE METHOD

(75) Inventors: Haruna Kawashima, Tochigiken (JP);
Ayako Kadono, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 383 days.

(21) Appl. No.: 11/567,499

(22) Filed: Dec. 6, 2006

(65) Prior Publication Data

US 2007/0132981 A1    Jun. 14, 2007

(30) Foreign Application Priority Data

Dec. 8, 2005    (JP)    ............................. 2005-354543

(51) Int. Cl.
*G03B 27/42*    (2006.01)
*H01L 21/00*    (2006.01)

(52) U.S. Cl. ........................... 355/53; 355/77; 430/311

(58) Field of Classification Search ................... 355/30, 355/53, 67, 52, 55, 62, 63, 77; 250/201.1, 250/559.3, 548, 559; 430/311
See application file for complete search history.

(56) References Cited

U.S. PATENT DOCUMENTS 6,768,546 B2    7/2004    Sato

2003/0025890 A1*    2/2003    Nishinaga ..................... 355/53

FOREIGN PATENT DOCUMENTS

JP    H09-190969    7/1997

OTHER PUBLICATIONS

Jan van Schoot et al., CD Uniformity Improvement by Active Scanner Corrections, Proceedings of SPIE, 2002, pp. 304-314, vol. 4691, SPIE.

* cited by examiner

*Primary Examiner*—Hung Henry Nguyen
*Assistant Examiner*—Mesfin T Asfaw
(74) *Attorney, Agent, or Firm*—Rossi, Kimms & McDowell LLP

(57) ABSTRACT

An exposure method includes the steps of exposing a pattern of a reticle onto a substrate by scanning the reticle and the substrate, and by illuminating an illumination area having a slit shape on the reticle using a light from a light source, the slit shape having a longitudinal direction corresponding to a direction orthogonal to a scanning direction, and correcting an accumulated illuminance in the scanning direction at each position of the illumination area in the longitudinal direction, wherein the correcting step includes the steps of calculating a first illuminance correction amount common to plural areas on the substrate, the pattern being to be transferred to each area, and calculating a second illuminance correction amount intrinsic to each area, the correcting step correcting the accumulated illuminance based on the first and second illuminance correction amounts.

10 Claims, 16 Drawing Sheets

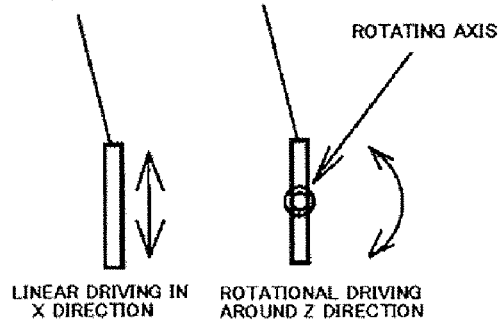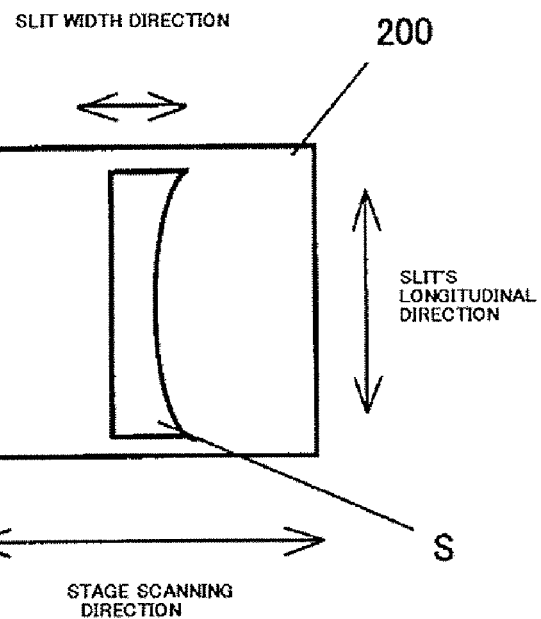
FIG.3A  FIG.3B
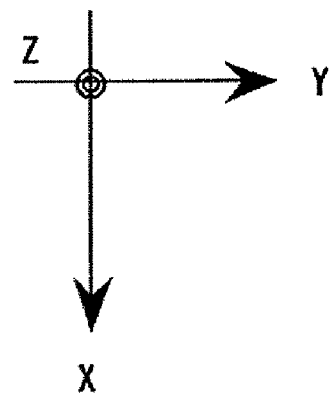
FIG.3C

EXPOSURE METHOD

BACKGROUND OF THE INVENTION

The present invention relates to an exposure method.

A projection exposure apparatus that employs a projection optical system to expose a reticle (mask) pattern onto a wafer has been conventionally used. A scanning exposure apparatus has recently been reduced to practice for wide-screen exposure. The precision required for a pattern's critical dimension ("CD") uniformity becomes stricter as the fine processing develops.

In order to reduce the uneven illuminance on the screen that aggregates the CD uniformity, the conventional scanning exposure apparatus controls the exposure dose using a light blocking plate near a scan masking blade that defines an illumination area or slit. For example, the exposure dose around the light blocking plate is set to be larger when the optical system has a higher transmittance at the center of the optical axis than at the periphery.

Prior art includes, for example, Japanese Patent Application, Publication No. 9-190969, and CD Uniformity Improvement by Active Scanner Corrections, Jan Van Schoot et al., Proceedings of SPIE, Vol. 4691, SPIE, 2002, pp. 304-314 ("Schoot" hereinafter).

The conventional exposure apparatus corrects a CD error caused mainly by the exposure apparatus, as in Japanese Patent Application, Publication No. 9-190969. The conventional exposure apparatus adjusts the uneven illuminance in a direction corresponding to a direction orthogonal to a scanning direction using a slit width adjusting mechanism. The slit width adjusting mechanism generally includes a mechanical blade, adjusts the uneven illuminance whenever an illumination mode and a numerical aperture ("NA") of the projection optical system are varied. The uneven illuminance among wafers and shots have not been corrected.

However, as suggested by Schoot above, it has recently been required to correct a deterioration of the CD error caused by processes and apparatuses other than the exposure apparatus, such as a coater, a developer, an etcher, and a reticle imaging apparatus. Schoot discloses means for correcting the uneven illuminance by moving, in the scanning direction, a gray filter that has a different distribution according to positions. Nevertheless, this means requires a driving mechanism similar to the reticle stage to drive the filter in the scanning direction and to correct the uneven illuminance, and would cause in a large exposure apparatus and an increased cost.

SUMMARY OF THE INVENTION

The present invention is directed to an exposure method that can highly precisely reduce a CD error caused by apparatuses other then an exposure apparatus.

An exposure method according to one aspect of the present invention includes the steps of exposing a pattern of a reticle onto a substrate by scanning the reticle and the substrate, and by illuminating an illumination area having a slit shape on the reticle using a light from a light source, the slit shape having a longitudinal direction corresponding to a direction orthogonal to a scanning direction, and correcting an accumulated illuminance in the scanning direction at each position of the illumination area in the longitudinal direction, wherein the correcting step includes the steps of calculating a first illuminance correction amount common to plural areas on the substrate, the pattern being to be transferred to each area, and calculating a second illuminance correction amount intrinsic to each area, the correcting step correcting the accumulated illuminance based on the first and second illuminance correction amounts.

A further object and other characteristics of the present invention will be made clear by the preferred embodiments described below referring to accompanying drawings.

BRIEF DESCRIPTION OF THE DRAWINGS

FIGS. 3A and 3B are schematic plane views of uneven-illuminance correctors shown in FIG. 2. FIG. 3C is a schematic plane view showing a relationship between the slit irradiated onto a reticle shown in FIG. 2 and the scanning direction.

DESCRIPTION OF THE EMBODIMENTS

Figure 1:
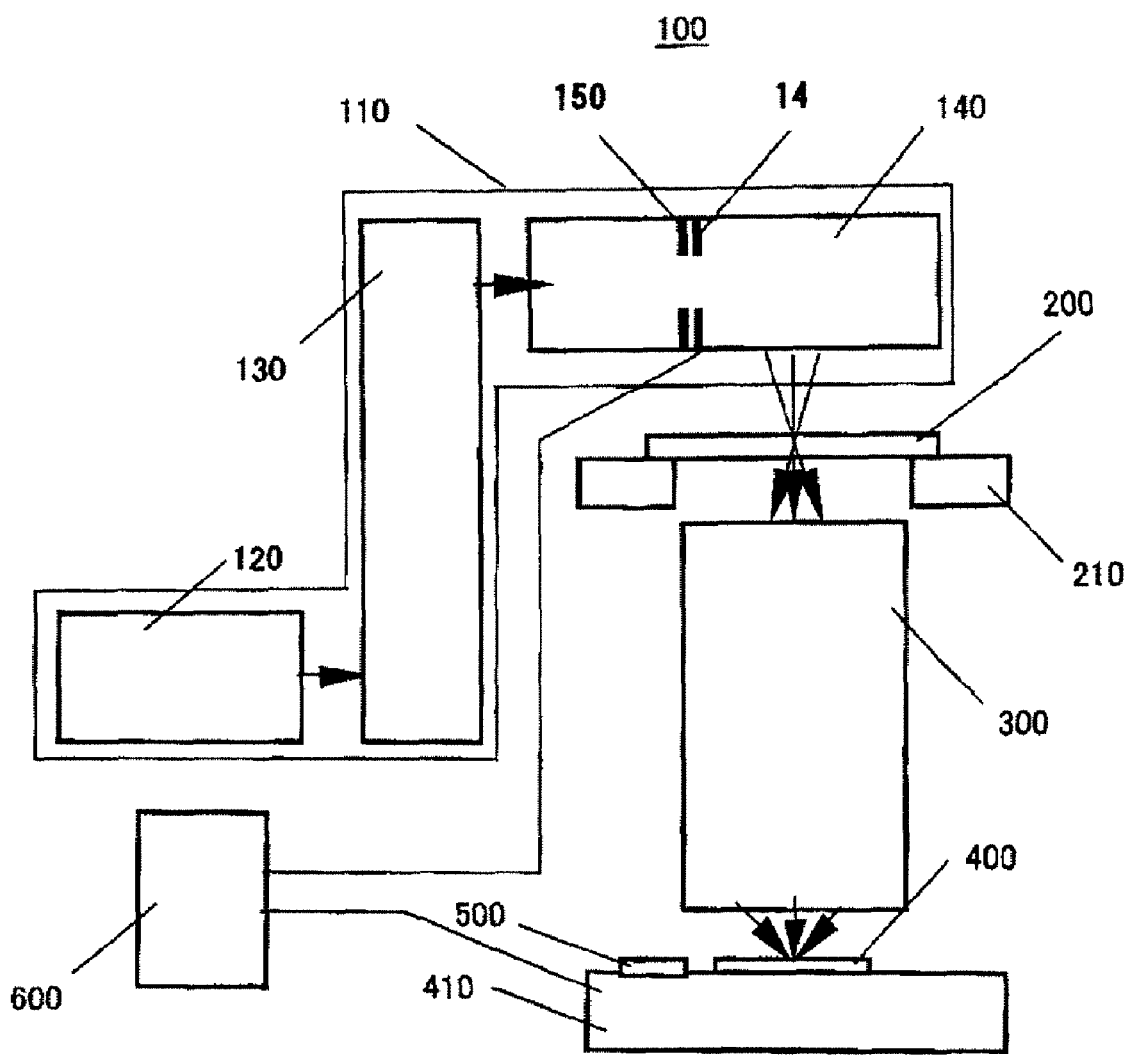
FIG. 1 is a scanning exposure apparatus according to one aspect of the present invention.

Referring now to the accompanying drawings, a scanning exposure apparatus 100 according one aspect of the present invention. Here, FIG. 1 is a schematic sectional view showing a structure of the exposure apparatus 100. The exposure apparatus 100 is a scanning exposure apparatus that exposes a circuit pattern of a reticle 200 onto a wafer 400 in a step-and-scan manner. The exposure apparatus 100 includes, as shown in FIG. 1, an illumination apparatus 110, a reticle stage 210 that supports the reticle 200, a projection optical system 300, a wafer stage 410 that supports the wafer 400, a measurement apparatus 500, and a control system 600.

The illumination apparatus 110 illuminates the reticle 200 that has a circuit pattern to be transferred. The illumination apparatus 110 includes a light source unit 120, and an illumination optical system (130, 140).

The light source unit 120 uses, as a light source, an ArF excimer laser with a wavelength of approximately 193 nm in this embodiment. However, the light source unit 120 is not limited to the ArF excimer laser, and may use, for example, a KrF excimer laser with a wavelength of approximately 248 nm, and an $F_2$ laser with a wavelength of approximately 157 nm.

The illumination optical system uniformly illuminates a slit-shaped illumination area on the reticle 200 using the light from the light source, and includes an introducer 130, and a uniformizer 140.

The introducer 130 has a mechanism that makes the laser beam incoherent, and a beam shaping system that uses, for example, a beam expander having plural cylindrical lenses. The beam shaping system shapes the beam shape into a desired one.

Figure 2:
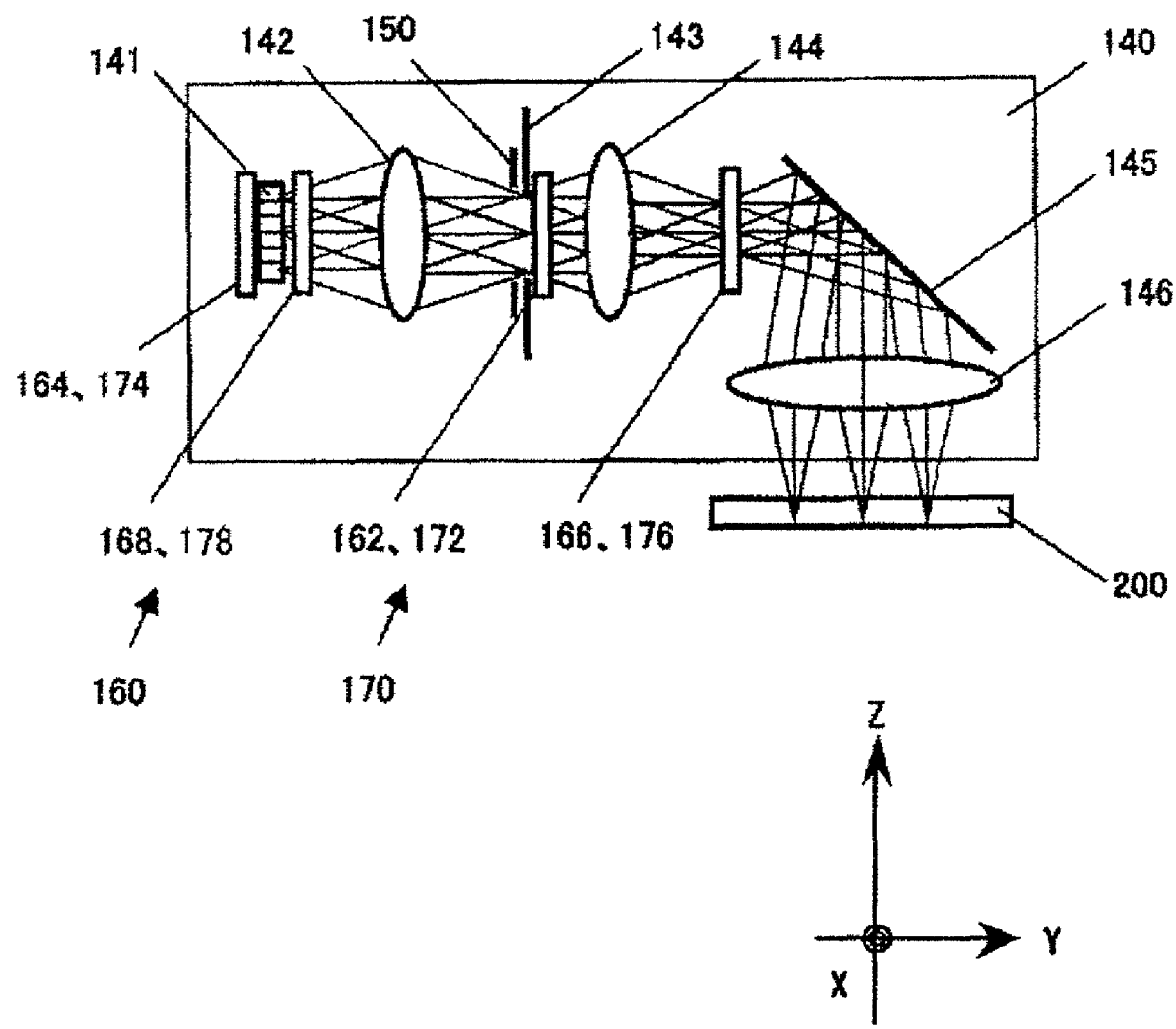
FIG. 2 is a partially enlarged sectional view of an illumination optical system in the exposure apparatus shown in FIG. 1.

The uniformizer 140 defines a slit-shaped illumination area or slit. The uniformizer 140 includes, as shown in FIG. 2, a fly-eye lens 141, a lens 142, a scan masking blade 143, a first uneven-illuminance ("UI") corrector 150, and an imaging optical system. Here, FIG. 2 is a schematic sectional view of the uniformizer 140.

The fly-eye lens 141 is a wavefront-splitting light integrator that splits the wavefront of the incident light, and forms plural secondary light sources near the exit plane. The fly-eye lens 141 emits the light while converting an angular distribution of the incident light into a positional distribution. Thus, the incident plane and the exit plane have a Fourier transformation relationship, which means an optical relationship between a pupil and an object plane or image plane or between the optical plane or image plane and the pupil plane. The fly-eye lens 141 includes plural incorporated fine lens elements in this embodiment. The fly-eye lens 141 may be replaced with an integrator including two sets of cylindrical lens arrays, an optical rod, a diffraction grating, and another light integrator.

The lens 142 maintains a conjugate relationship between the exit plane of the fly-eye lens 141 and the scan masking blade 143. As a result, the scan masking blade 143 is Koehler-illuminated with the lights from the fly-eye lens 141. The scan masking blade 143 is arranged conjugate with the pattern plane of the reticle 200, and defines a size of the slit as a transfer area on the wafer 400 in synchronization with the stages 210 and 410 during the scan exposure.

The imaging optical system includes a lens 144, a deflection mirror 145, and a lens 146, and maintains a conjugate relationship between the scan masking blade 143 and the pattern plane of the reticle 200. The pattern plane of the reticle 200 is Koehler-illuminated. The deflection mirror 145 deflects the optical path by about 45° in FIG. 2. In FIG. 2, the scanning direction is the Y direction, but would be the Z direction without the deflection mirror 145. In order to correlate the scanning direction and the XYZ directions irrespective of the deflection mirror, the instant application sometimes refers to a direction that is deflected to a predetermined direction or a direction that accords with the predetermined direction without a deflection as a "direction corresponding to the predetermined direction." In FIG. 2, the scanning direction is the Y direction, but the direction corresponding to the scanning direction or slit width direction is the Z direction. A direction corresponding to the slit's longitudinal direction is the X direction.

Each of the lenses 142, 144 and 146 includes plural lenses, but FIG. 2 simplifies them.

The illumination optical system of this embodiment includes a first UI corrector 150, a second UI corrector 160, and a third UI corrector 170. The correctors 150-170 serve to adjust accumulated illuminance at each position in the slit's longitudinal direction orthogonal to the scanning direction. It is optional to provide the third UI corrector 170.

Figure 4:
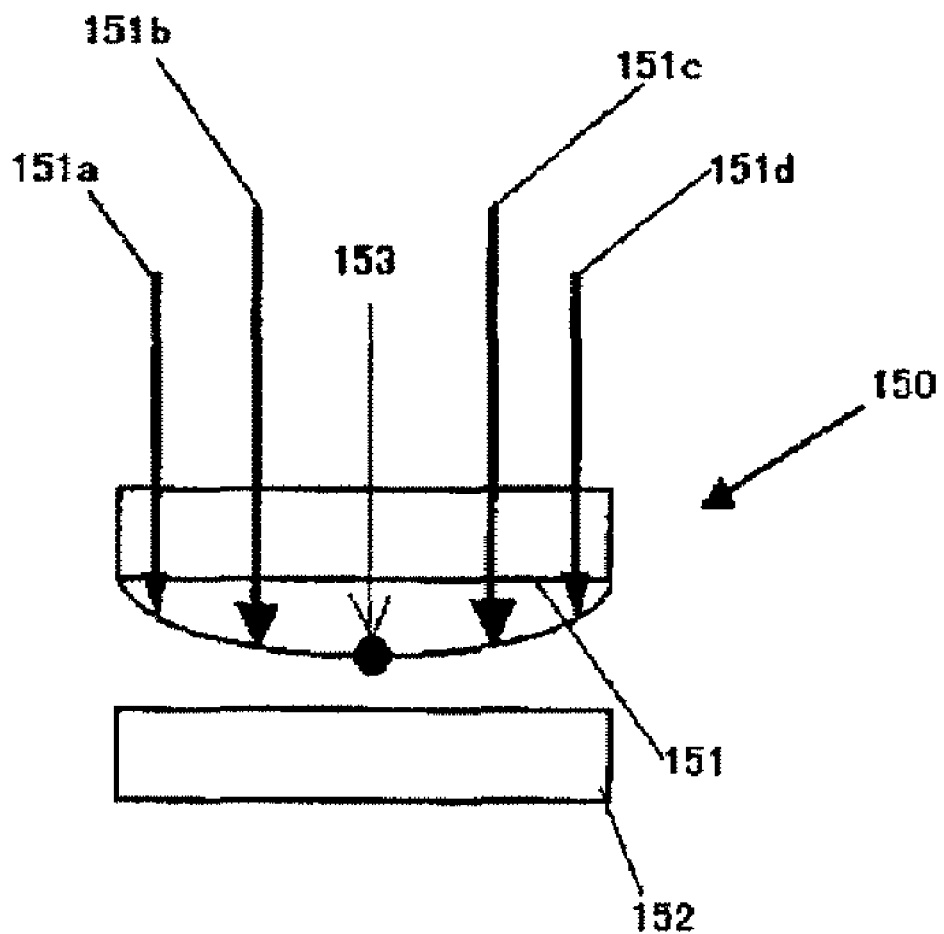
FIG. 4 is a schematic plane view of a first uneven-illuminance ("UI") corrector shown in FIGS. 1 and 2.

The corrector 150 serves to correct a CD error caused by the uneven illuminance of the exposure apparatus, and is arranged before the scan masking blade 143 near the conjugate plane with the pattern plane of the reticle 200. FIG. 3C is a schematic plane view of a slit or illumination area S formed by the corrector 150. The corrector 150 has a slit width varying mechanism that maintains the illuminance distribution set for each shot. The corrector 150 includes, as shown in FIG. 4, plural blades or light blocking plates including a movable blade 151 and a fixed blade 152. Here, FIG. 4 is a schematic plane view of the corrector 150. The movable blade 151 has plural adjusting mechanisms 151a to 151d arranged in the longitudinal direction or X direction in FIG. 4 so as to arbitrarily adjust the slit width at respective positions arranged in the slit's longitudinal direction (X direction). The slit width is an interval between the blades 151 and 152 in the Z direction corresponding to the scanning direction. A fixed shaft 153 is provided at the center so as to maintain the accumulated illuminance at the slit's center. As shown in FIG. 3C, the corrector 150 sets a slit width so that the uneven illuminance on the reticle plane is higher at the peripheral than at the center so as to maintain the resultant accumulated illuminance on the wafer 400 plane via the projection optical system 300.

The CD error factors caused by the exposure apparatus 100 contain A) residue aberrations of the illumination and projection optical systems, B) transmittance characteristics of the illumination and projection optical systems, and C) changes of the exposure condition of the illumination and projection optical systems, such as an NA of the projection optical system, an illumination mode (e.g., a modified illumination). The factor A is the uneven illuminance caused by the residue aberration in the optical design, and differs depending upon an image height and the factor C. The factor B depends mainly upon an optical characteristic of the optical thin film, and exhibits a lower transmittance at the screen periphery than at the screen center, which tends to change in a rotationally symmetrical manner. Depending upon the incident angle of the light upon the mirror in the optical system, a lower transmittance can change in a rotationally asymmetrical manner at the screen periphery. In addition, a film characteristic becomes uneven on a surface of a larger lens or mirror along with the high NA scheme of the exposure apparatus 100, and the change of the accumulated illuminance distorts in the level of about 0.5% to about 1%. The factor B also depends upon the image height and the factor C. The exposure condition of the factor C varies according to products and processes. The corrector 150 corrects the uneven illuminance caused by the exposure apparatus for each exposure job.

The corrector 160 improves the CD uniformity on the wafer 400 plane, and handles the following factors that will not be corrected by the corrector 150. These factors contain 1) a reticle's imaging error, 2) multiple reflection flare between the projection optical system and the wafer plane, 3) an uneven thickness of the coater applied resist, 4) an uneven development of the resist by the developer, 5) uneven etching by an etcher, and 6) another uneven process by a processing unit. The factor 1 is known as a correction amount intrinsic to each reticle because a CD error amount is measured every shipped reticle. A flare amount for the factor 2 is calculated and converted into a CD error once information about the reflectance of the resist applied wafer plane, the reflectance of the projection optical system, a lens shape, and an exposure shot layout on the wafer is given. Other factors can be converted into CD error amounts from information of each processing unit. Alternatively, a pilot wafer is previously exposed and its CD error is measured. This actual measurement provides a mixed error of these factors.

The corrector 160 converts a CD error amount corresponding to the above factors into the uneven illuminance, and correct it.

The corrector 160 provides an adjustment common to all the shots for the factor 1. When the imaging error has approximately the same tendency over the entire screen, the corrector 160 sets a common adjustment amount in exposing each shot. When the factor 1 is different in the screen, the corrector 160 changes the adjustment amount common to each shots in synchronization with the scan exposure.

The corrector 160 provides a different adjustment according to shots for the factors 2 to 6. On the wafer plane, there can occur a CD error that is rotationally symmetrical in the wafer's circumferential direction, a CD error that has a gradient tendency in the entire plane, and a combination of these CD errors. When CD error variation on the wafer plane is approximately the same tendency in a shot, an intrinsic adjustment amount is set to the corrector 160 in exposing each shot. When a CD error variation on the wafer plane is different in the shot, the corrector 160 varies an intrinsic adjustment amount in synchronization with the scan exposure. When the factor 1 has approximately the same tendency over the entire screen has a high order distribution that cannot be corrected by a gradient adjustment by the corrector 160, a common adjustment amount is set to the corrector 150 in exposing each shot.

Table 1 shows items to be adjusted by the correctors 150 and 160:

160 generates a resultant accumulated illuminance of a linear function with the corrector 150. The corrector 170 generates a resultant accumulated illuminance of a high order function with the corrector 150.

The correctors 160 and 170 are classified into two types. The first type includes correctors 162, 164, 172, and 174 that are arranged optically conjugate with the pattern plane of the reticle 200. The second type includes correctors 166, 168, 176, and 178 that have an optically Fourier transformation relationship with the pattern plane of the reticle 200.

The corrector 162 is arranged near the scan masking blade 143, and the corrector 164 is arranged near the incident plane of the fly-eye lens 141. Each of the correctors 162 and 164 includes, for example, an ND filter that optically adjusts a transmitting light quantity and changes, according to a slit position, the transmittance in the X direction in FIG. 2. For example, when the fly-eye lens 141 is viewed from the left side in FIG. 2, the corrector 164 includes one substrate with plural ND filter areas arranged in a matrix, each of which corresponds to each fine lens element of the fly-eye lens 141. The ND filter can control a transmittance in a specified area by depositing a Cr film with different thicknesses according to positions, or by changing a fine light-blocking dot pattern arrangement density according to positions.

According to the first type, in order to change the accumulated illuminance in the slit's longitudinal direction, the correctors 162 and 164 are linearly driven in the X direction corresponding to the slit's longitudinal direction, as shown in FIG. 3A. A simple linear movement structure is suitable for the durability and a fast movement enough for the throughput. Here, FIG. 3A is a schematic plane view of FIG. 2 viewed from the Z direction, showing a driving direction for each of the correctors 162, 164, 172, and 174.

The corrector 166 is arranged on the pupil between lens 144 and the deflecting mirror 145, and the corrector 168 is arranged near the exit plane of the fly-eye lens 141. Each of the correctors 166 and 168 includes, for example, a filter that optically adjusts a transmitting light quantity, and has a different transmittance that depends upon the incident angle of the light.

The lights incident upon the corrector 166 in FIG. 2 includes three lights that go up to the right, three parallel lights, and three lights that go down to the right. On the reticle 200, the light that goes up to the right forms an image to the left on the reticle 200, the parallel light forms an image at the center, and the light that goes down to the right forms an image to the right. An angle of the incident light on the pupil plane corresponds to a position on the imaging plane, and an

TABLE 1

|  | CD CORR. IN SLIT'S LONG DIRECTION | 1ST CORREC. 150 | 2ND CORRECTOR 160 | SWITCHING OF CORRECTION | OFFSET | |
|  |  |  |  |  | 1ST CORREC. 150 | 2ND CORREC. 160 |
| --- | --- | --- | --- | --- | --- | --- |
| FACs. A-C | COMMON TO SHOTS | (HIGH ORDER) | — | INTRINSIC TO JOB | 10 | — |
| FAC. 1 | COMMON TO SHOTS | (HIGH ORDER) | (GRAD.) | INTRIN. TO RETICLE | 2 | 3 |
| FACs. 2-6 | INTRINSIC TO EACH SHOT | — | (GRAD.) | INTRINSIC TO JOB | — | 6(n) |

The correctors 160 and 170 correct a CD error caused by an apparatus other then the exposure apparatus. The corrector optical filter usable for these correctors 166 and 168 can use, for example, a band-pass filter. The band-pass filter possesses a characteristic that has a high transmittance only to the normally incident light having a specific wavelength, and the transmittance lowers as a difference from the incident angle increases even for the light having the same wavelength. Assume that the peak transmission wavelength of the band-pass filter is set slightly longer than the exposure wavelength of the exposure apparatus, the transmittance of the normal incidence is made 80%, and the incident angle is 100. Then, the thin film that has a peak transmittance of 100% can be designed.

According to the second type, in order to change the accumulated illuminance in the slit's longitudinal direction, the correctors 166 and 168 are rotated on the XY plane around the Z-axis corresponding to the slit width direction or the scanning direction, as shown in FIG. 3B. A simple rotation structure is suitable for the durability and a fast movement enough for the throughput. Here, FIG. 3B is a schematic plane view of FIG. 2 viewed from the Z direction, showing a driving direction for each of the correctors 166, 168, 176, and 178.

Figure 5:
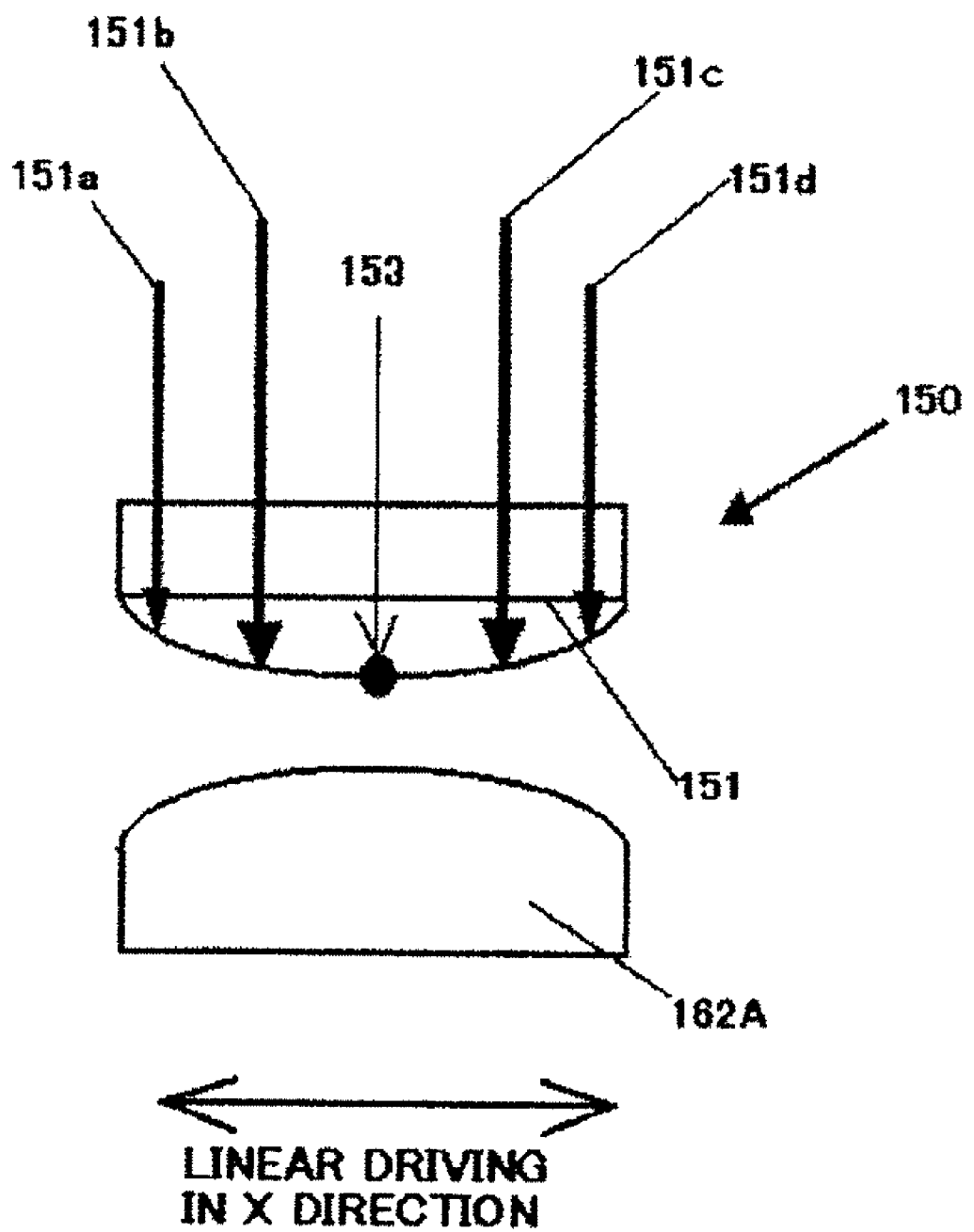
FIG. 5 is a schematic plane view of an illustrative structure of the first and second UI correctors shown in FIGS. 1 and 2.
Figure 6:
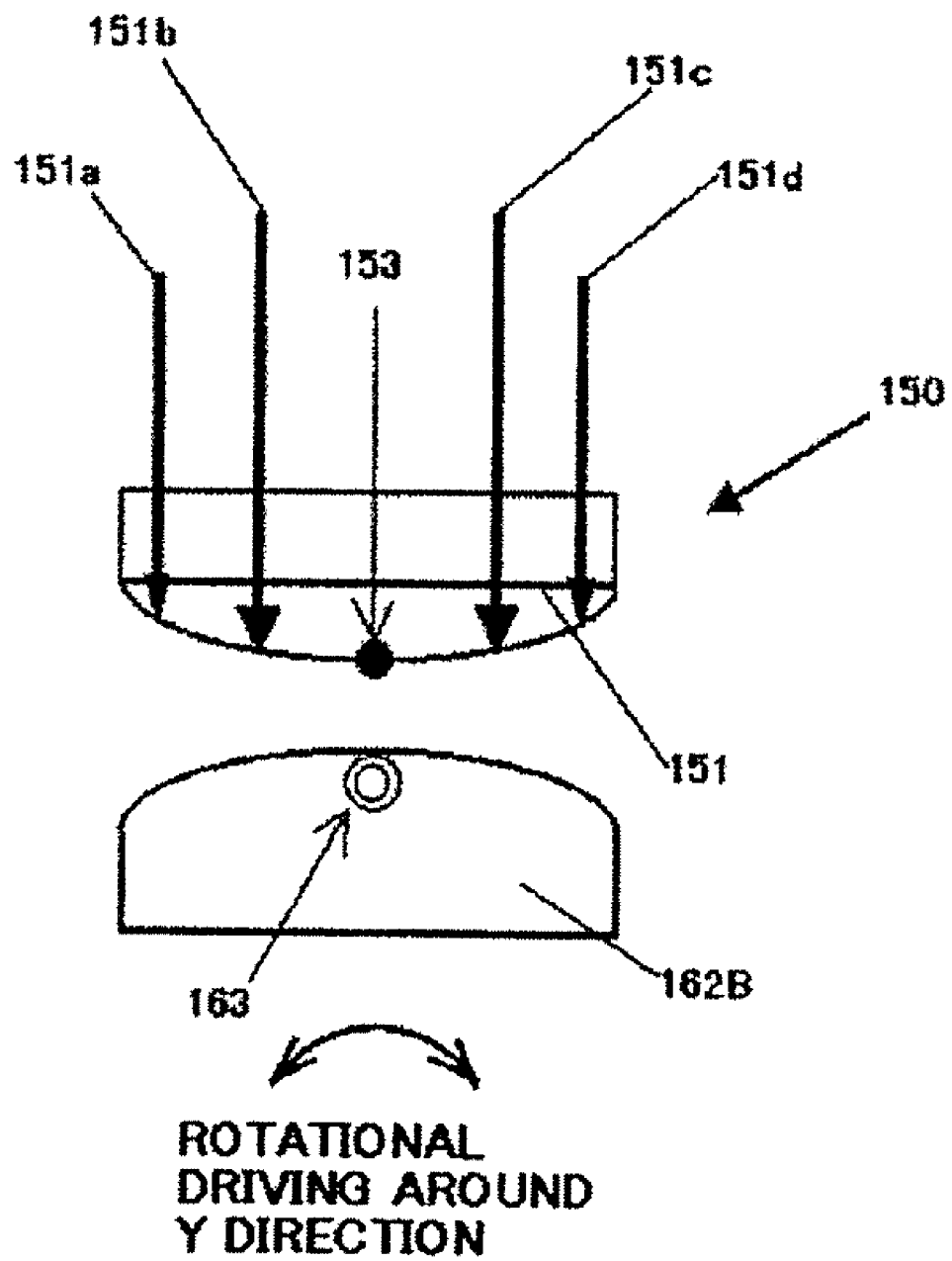
FIG. 6 is a schematic plane view of another illustrative structure of first and second UI correctors shown in FIGS. 1 and 2.

The corrector 160 may have a mechanical means, such as a light blocking plate, in addition to the optical filter. Referring to FIGS. 5 and 6, a description will be given of correctors 162A and 162B that include mechanical means. Here, FIG. 5 is a schematic plane view of the correctors 150 and 162A. FIG. 6 is a schematic plane view of the correctors 150 and 162B.

The corrector 162A can adjust a gradient of the uneven illuminance change in the slit when linearly moving in the X direction. The corrector 162B has a rotating shaft 163 that is rotatable around the Y-axis parallel to the optical axis. The corrector 162B approximates to a rotation around the Y-axis a gradient amount of the uneven illuminance change in the slit obtained by the linear movement in the X direction of the corrector 162A. The rotation is advantageous to a miniaturization of a driving guide and a motor.

The reticle manufacturing process includes electron beam imaging, etching, and other processes. On the reticle plane, there can occur a CD error that is rotationally symmetrical in the reticle's circumferential direction, a CD error that has a gradient tendency on the entire plane, and a combination of these CD errors. The corrector 170 provides a rotationally symmetrical correction to the reticle imaging error. The corrector 170 includes, as shown in FIGS. 2, 3A, and 3B, correctors 172-178 that have a conjugate or Fourier transformation relationship with the pattern plane of the reticle 200. For example, in FIG. 2, the corrector 160 is the corrector 166, and the corrector 170 is the corrector 172. Alternatively, the corrector 160 may be the corrector 164, and the corrector 170 may be the corrector 172.

The corrector 170 is arranged at a position close to or different from that of the corrector 160. The corrector 170 includes two ND filters. The accumulated illuminance in each slit in the slit's longitudinal direction tends to change from the slit center to the periphery. In this embodiment, one ND filter has a cubically increasing tendency, and the other ND filter has a cubically decreasing tendency. A pair of ND filters maintain the accumulated illuminance in the slit's longitudinal direction constant from the slit center to the periphery at the nominal position at which these filters' center positions or peak values of the cubic changes overlap each other. The cubic function is merely illustrative, and the present invention does not limit a type of the function.

When a pair of ND filters shift to each other in the slit's longitudinal direction, the accumulated illuminance in the slit's longitudinal direction can be increased or decreased in a quadratic changing tendency. The corrector 174 may be arranged on a plane conjugate with the image plane on the incident side of the fly-eye lens 141, and include, similar to the corrector 164, a pair of ND filters for optically adjusting the transmitting light quantity. The number of pairs corresponds to the number of fine lens elements of the fly-eye lens 141 on the XZ plane.

Each of the correctors 176 and 178 similarly includes a pair of filters. Each filter's optical characteristic changes as the filter rotates such that the scan accumulated illuminance cubically changes with respect to a position along a slit direction. The correctors 176 and 178 have a filter having a cubically increasing tendency of the accumulated illuminance and a filter having a cubically decreasing tendency of the accumulated illuminance. When the pair of optical filters angularly shift to each other, the accumulated illuminance in the slit's longitudinal direction can be increased or decreased in a quadratic changing tendency.

The reticle 200 is fed from the outside of the exposure apparatus 100 by a reticle feed system (not shown), and is supported and driven by the reticle stage 210. A pattern of the reticle 200 is projected onto the wafer 400 by the projection optical system 300. The reticle 200 and the wafer 400 are located in an optically conjugate relationship.

The projection optical system 300 can use a dioptric, catadioptric, or catoptric optical system.

The wafer 400 is fed from the outside of the exposure apparatus 100 by a wafer fed system (not shown), and supported and driven by the wafer stage 410. Instead of the wafer 400, a glass plate and another substrate can be used. A photoresist is applied onto the wafer 400.

The wafer stage 410 supports the wafer 400 via a wafer chuck (not shown). The wafer stage 410 serves to adjust a position in the Z direction, a rotational direction, and an inclination of the wafer 400, under control of a control system 600. During exposure, the control system 600 controls the wafer stage 410 so that the surface of the wafer 400 always accords with the focal plane of the projection optical system 300 with high precision.

The measurement apparatus 500 measures the illuminance and the uneven illuminance, and the control system 600 controls driving of the reticle stage 210 and the wafer stage 410.

In exposure, the introducer 130 makes incoherent the light emitted from the light source unit 120, properly shapes the beam shape, and introduces the light to a uniformizer 140. The light made uniform by the uniformizer 140 Koehler-illuminates the reticle 200 in a slit-shaped illumination area defined by the scan masking blade 143. In that case, the first corrector 150 corrects CD error caused by the exposure apparatus 100, and the second and third correctors 160 and 170 correct the CD errors caused by an apparatus other than the exposure apparatus 100.

Figure 7:
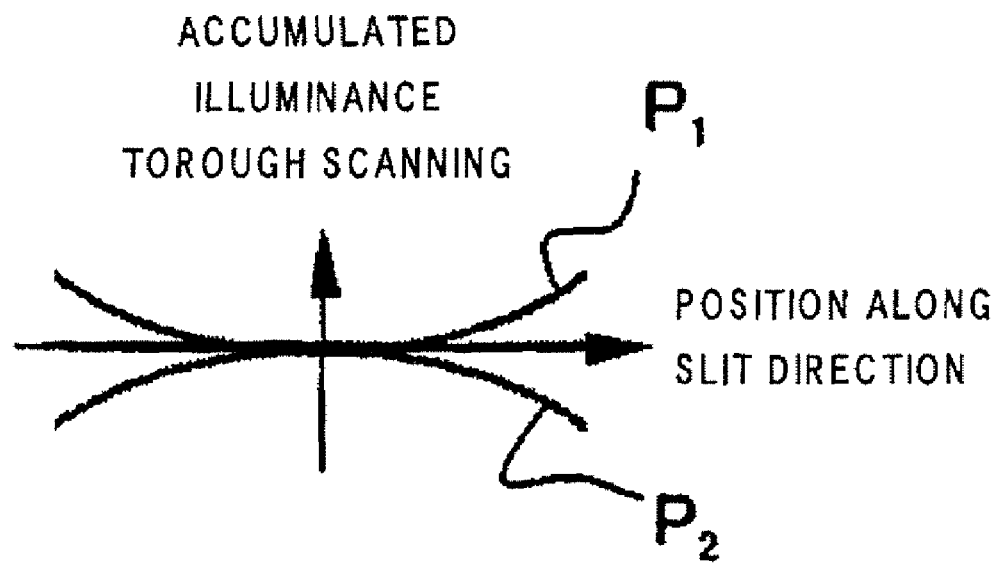
FIG. 7 is a graph showing an illustrative synthesized, accumulated luminance formed by the first and second UI correctors shown in FIG. 2.
Figure 8:
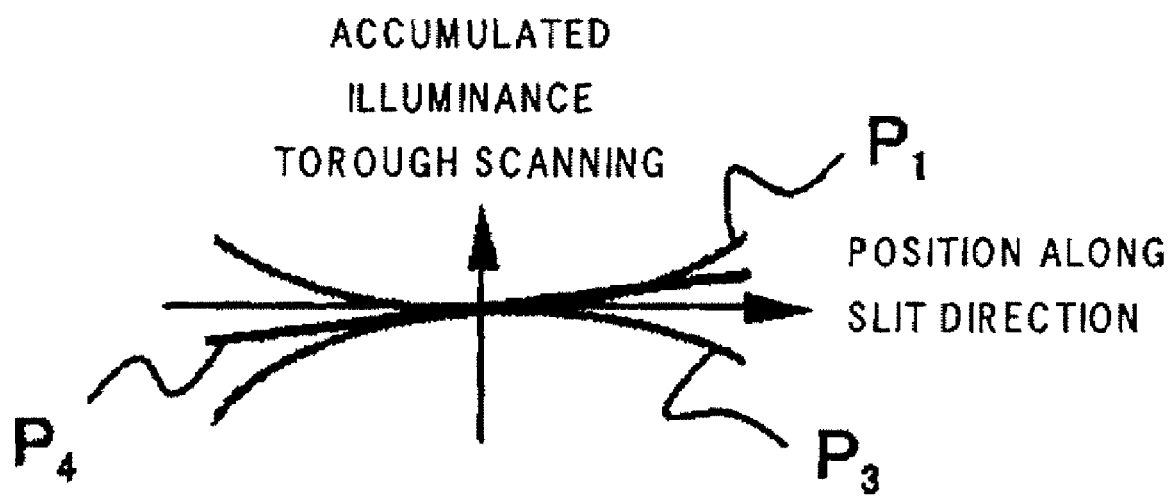
FIG. 8 is a graph showing another illustrative synthesized, accumulated luminance formed by the first and second UI correctors shown in FIG. 2.

Referring now to FIGS. 7 and 8, a description will be given of a correction method of this embodiment.

Referring now to FIG. 7, the corrector 150 adjusts the accumulated illuminance in the slit's longitudinal direction to an accumulated illuminance $P_1$ expressed by an approximately quadratic function with respect to a position from the slit center to the periphery. The variable slit width of the corrector 150 shown in FIG. 4 can provide this adjustment. For the factors A to C, the corrector 150 adjusts the accumulated illuminance as expressed by an approximately quadratic function with respect to a position from the slit center to the periphery based on a state of a uniformly adjusted accumulated illuminance.

In FIG. 7, the corrector 160 adjusts the accumulated illuminance in the slit's longitudinal direction to an accumulated illuminance $P_2$ that has a reverse code to the accumulated illuminance $P_1$ formed by the corrector 150, and is expressed by an approximately quadratic function with respect to a position from the slit center to the periphery. This adjustment is obtained when the characteristic of the corrector 160 is set to the nominal or initial position. In case the accumulated illuminance of approximately quadratic function of a position is not obtained at the initial state, the initial position is adjusted and a position at which the accumulated illuminance can be laterally symmetrical with respect to the slit center is reset to the nominal position of the corrector 160.

As a result of the synthesis between the accumulated illuminances $P_1$ and $P_2$ formed by the correctors 150 and 160, the approximately uniform accumulated illuminance is made in the slit's longitudinal direction on the wafer plane. In practice, the corrector 160 is set to the nominal position, and the variable slit width of the corrector 150 is adjusted so that the accumulated illuminance becomes uniform from the slit center to the priory.

Next, in FIG. 8, the corrector 160 provides an adjustment using an accumulated illumination $P_3$ that is made by laterally moving the accumulated illumination $P_2$ expressed by an approximately quadratic function with respect to a position. As a result, a synthesized accumulated illuminance $P_4$ formed by the correctors 150 and 160 is expressed by a linear function with respect to a position.

Figure 9:
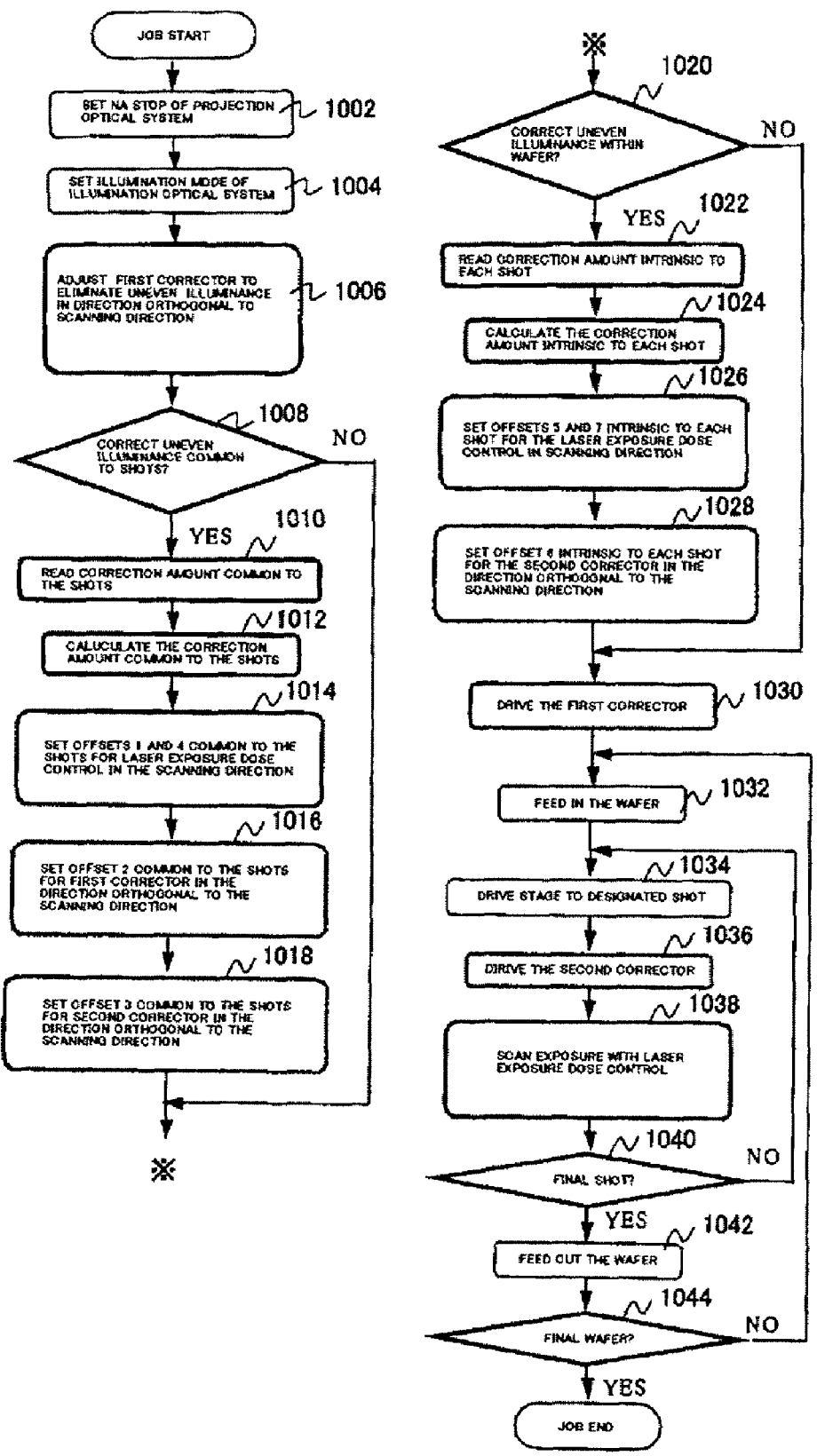
FIG. 9 is a flowchart for explaining a UI correction method according to a first embodiment of the present invention.

Referring now to FIG. 9, a description will be given of a correction method of a first embodiment. Initially, an exposure Job starts, an NA stop of the projection optical system 300 is set (step 1002), and an illumination mode of the illumination optical system is set or switched (step 1004). Next, in the initial state of the corrector 160, the corrector 150 is adjusted so as to provide a uniform accumulated illuminance in a direction corresponding to the direction orthogonal to the scanning direction or the slit's longitudinal direction (or X direction in FIG. 2) (where the accumulation direction is the Y direction in FIG. 2) (step 1006).

Next, it is determined whether the uneven illuminance common to the shots is corrected (step 1008). With no correction, the procedure moves to the step 1020 below. If the step 1008 determines that the uneven illuminance is to be corrected, CD error correction data common to the shots is read (step 1010). The factor 1 is a major item to be corrected. The exposure apparatus automatically reads, as the correction data, inspection data of a reticle to be used (two-dimensional data expressed by an in-shot coordinate (x, y)).

Figure 10:
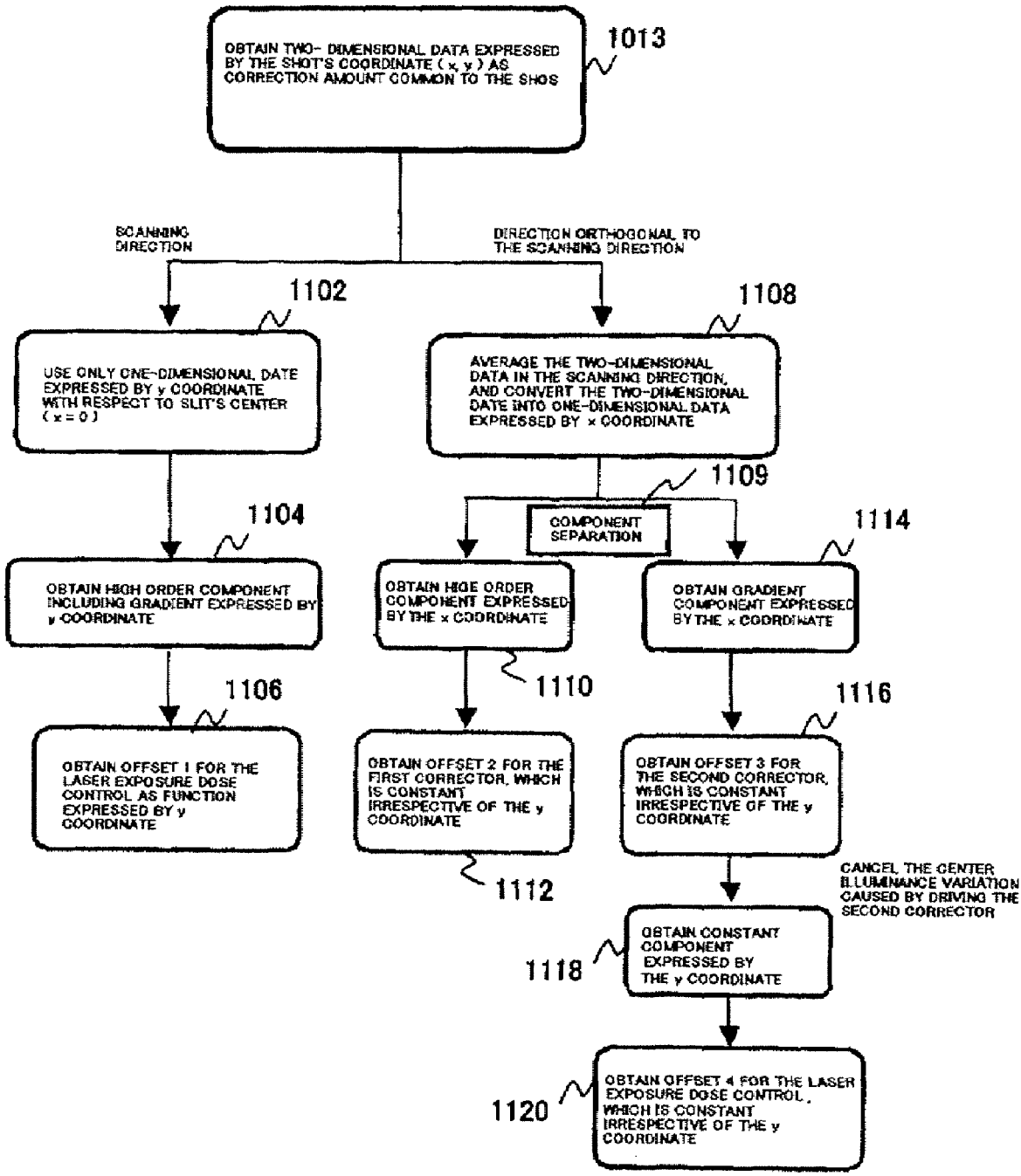
FIG. 10 is a flowchart for explaining a method for calculating correction amounts common to shots shown in FIG. 9.

Next, the uneven illuminance correction amount common to the shots is calculated (step 1012). Initially, the CD error correction value common to the shots is converted into the illuminance correction value. FIG. 10 shows a calculation method of various offsets when the illuminance correction amount is the two-dimensional data expressed by the in-shot coordinate (x, y). The laser exposure dose control uses two types of offsets 1 and 4 for the illuminance correction amount in the scanning direction. The offset can be expressed, for example in terms of percentage.

Referring now to FIG. 10, a description will be given of the calculation method of the correction amount common to the shots. The offset 1 is calculated from the one-dimensional data of y coordinate by taking only the slit center data (at x=0 or an average value of several points near x=0) from the two-dimensional data expressed by the in-shot coordinate (x, y) (step 1102). Then, a high-order continuous function including a gradient component expressed by the y coordinate is determined from the one-dimensional data through spline function fitting etc. so as to minimize an error (step 1104). The offset 1 is a value determined by this function (step 1106).

The offset 4 is determined by a flow for calculating the illuminance correction amount in the direction orthogonal to the scanning direction. The illuminance correction amount in the direction orthogonal to the scanning direction is calculated as two types of offsets 2 and 3. First, by averaging the two-dimensional data expressed by the in-shot coordinate (x, y) in the scanning direction, the two-dimensional data is converted into the one-dimensional data expressed by the x coordinate (step 1108). Then, a high-order continuous function including a gradient term expressed by the y coordinate is determined from the one-dimensional data of the x coordinate so as to minimize an error. This continuous function is separated between the gradient or linear term and the high order (step 1109). A high-order function expressed by the x coordinate is obtained (step 1110), and the offset 2 determined by the high-order function is set to a driving amount for the corrector 150 (step 1112). The linear function (gradient component) expressed by the x coordinate is obtained (step 1114), and the offset 3 determined by the linear function is set to a driving amount for the corrector 160 (step 1116). The offset 4 is determined as a variation of the accumulated illuminance at the slit center, which occurs when the offset 3 is set to the driving amount of the corrector 160. The offset 4 is a constant term to the y coordinate (step 1118), and used for the laser exposure dose control (step 1120). The offsets 1 to 4 are set to the memory in the exposure apparatus (steps 1014 to 1018).

It is now determined whether the uneven illuminance is corrected for each shot on a wafer (step 1020). When it is determined that no correction is performed (step 1020), the procedure moves to step 1030 below. When it is determined that the correction is performed (step 1020), a correction amount intrinsic to each shot is read (step 1022). The factors 2 to 6 are to be corrected. The correction amount is acquired from CD correction data common to the wafer, and a result of a pilot wafer prepared by the exposure apparatus and a process unit actually used for the process. The pilot wafer may use a CD measurement result on the wafer plane by picking up a sample out of product wafers. Alternatively, the scatterometry may be used for the pilot wafer. The scatterometry is a method of measuring the CD uniformity by exposing an inspection line and space ("L & S") pattern over a wafer plane, by irradiating the inspection light, and by measuring the diffracted light. The correction data is set when the exposure apparatus automatically reads in-wafer CD data or when a user manually inputs a correction amount from the result of the exposed pilot wafer.

Figure 11:
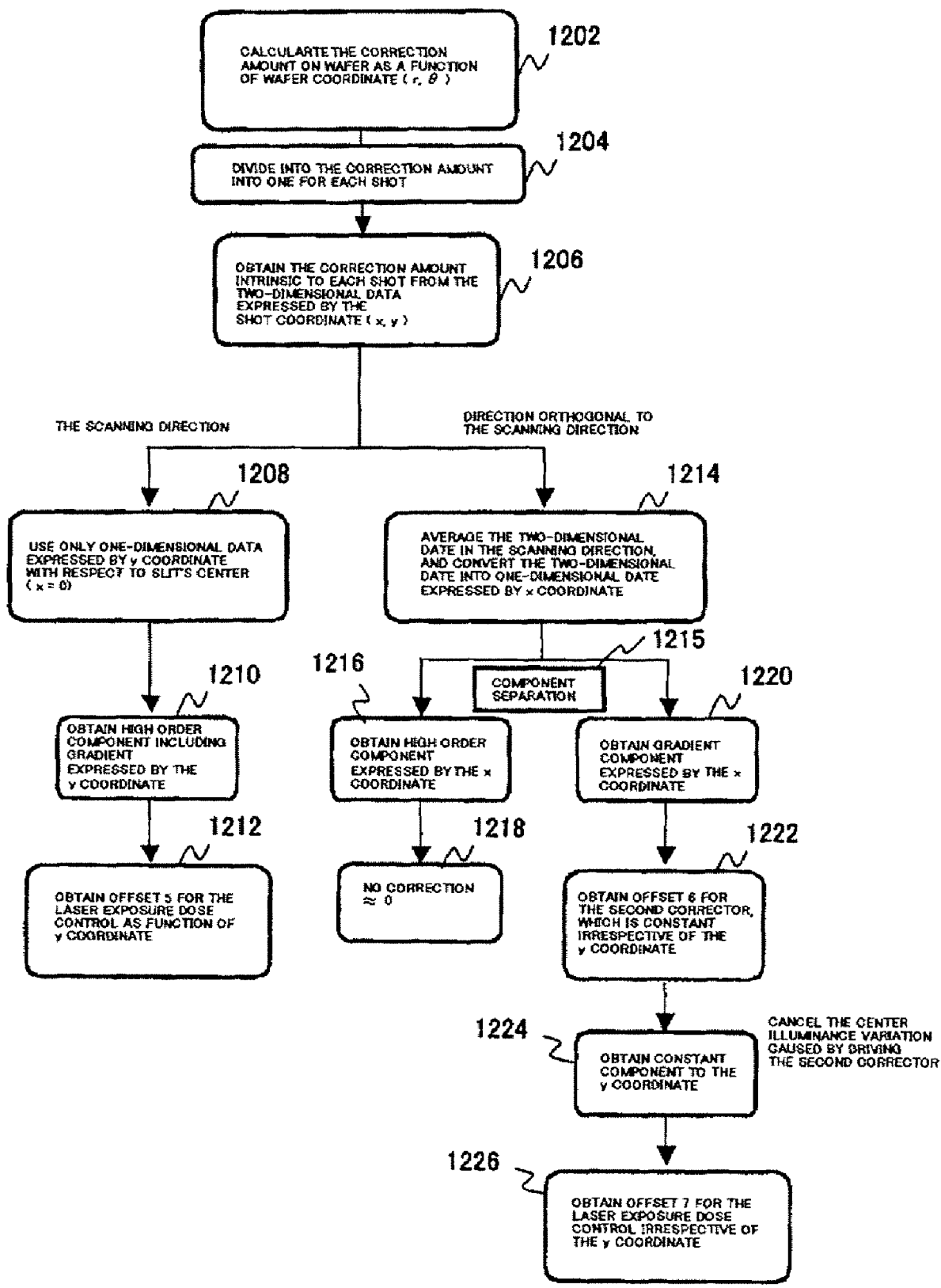
FIG. 11 is a flowchart for explaining a method for calculating correction amounts intrinsic to each shot shown in FIG. 9.

Next, the uneven illuminance correction amount intrinsic to each shot is calculated by converting the in-wafer CD error correction value into an illuminance correction amount (step 1024). Referring now to FIG. 11, a description will be given of the detail of the step 1024. First, a continuous function of a coordinate (r, θ), such as each coefficient of the Zernike function, is determined from the two-dimensional data expressed by the in-wafer illuminance correction amount so as to minimize an error (step 1202). The CD error correction amount on the wafer is affected by processing units that rotate and process, such as a coater and a developer, a continuous function of the polar coordinate (r, θ) is preferable because of high fitting precision. The Zernike function is an orthogonal independent function that is universally used to indicate the wavefront aberration of the projection optical system.

Next, an illuminance correction amount is calculated with a function of the polar coordinate (r, θ) every shot on the wafer (step 1204). The illuminance correction amount every shot is calculated as two-dimensional data expressed by the in-shot coordinate (x, y) A calculation method of offsets 5-7 is as shown in FIG. 10.

That is, the offset 5 is calculated from the one-dimensional data expressed by the y coordinate by taking only the slit center data (at x=0 or an average value of several points near x=0) from the two-dimensional data expressed by the in-shot coordinate (x, y) (step 1208). Then, a high-order continuous function including a gradient expressed by the y coordinate is determined from the one-dimensional data through spline function etc. so as to minimize an error (step 1210). The offset 5 is a value determined by this function (step 1212).

The offset 6 is determined by a flow for calculating the illuminance correction amount in the direction orthogonal to the scanning direction. First, by averaging the two-dimensional data expressed by the in-shot coordinate (x, y) in the scanning direction, the two-dimensional data is converted into the one-dimensional data to the x coordinate (step 1214). Then, a high-order continuous function including a gradient term expressed by the y coordinate is determined from the one-dimensional data of the x coordinate so as to minimize an error. This continuous function is separated between the gradient and the high order (step 1215). A high-order function component expressed by the x coordinate is obtained (step 1216). No correction is made with a value determined by this high-order function component (step 1218). A linear function (gradient component) expressed by the x coordinate is obtained (step 1220), and the offset 6 determined by the linear function is set to a driving amount for the corrector 160 (step 1222). The offset 7 is determined as a variation amount of the accumulated illuminance of the slit center, which occurs when the offset 6 is set to the driving amount of the corrector 160. The offset 7 is a constant term to the y coordinate (step 1224), and used for the laser exposure dose control (step 1226).

It is sufficient to consider only the gradient component to the y coordinate for the offset 5 and the x coordinate for the offset 6. This is because the CD correction amount on the wafer, which occurs due to the influence of the processing unit, can be a monotone increasing function or a monotone decreasing function.

Table 2 shows a relationship between the correctors and the offsets 1-7:

n-th shot comes to the exposure position (step 1034). Next, the corrector 160 is driven (step 1036). The corrector 160 drives by an amount of the offset 3 common to the shots added to the offset 6(n) intrinsic to each shot.

Next follows scan exposure (step 1038). The light that has passed is projected onto the wafer 400 at a predetermined reduction ratio due to the imaging action of the projection optical system 300. The entire shot is exposed by synchronously scanning the reticle 200 and the wafer 400 while the light source unit 120 and the projection optical system 300 are fixed. By stepping the stage 410 to the next shot, all the shots on the wafer 400 are exposed or transferred. Thereby, the exposure apparatus 100 corrects a CD error caused inside and outside the exposure apparatus, and provides a highly precise pattern transfer, and the resultant high-quality device, such as a semiconductor device, an LCD device, an image pickup device (e.g., a CCD), and a thin film magnetic head.

The laser exposure dose is controlled in synchronization with scanning by adjusting the pulsed energy of the light source laser, the number of irradiation pulses or light emitting intervals, or the stage scan speed (step 1038). First, the offset 4 common to the shots added to the offset 7(n) intrinsic to each shot, and set as a uniform correction amount during scanning. In addition, the offset 1 common to the shots is added to the offset 5(n) intrinsic to each shot, and set as a correction amount to be synchronously controlled during scanning. The stages are driven so that the next designated shot comes to the exposure position, and driving of the corrector 160 and scan exposure are repeated. When the scan exposure to the final shot ends (step 1040), the wafer 400 is fed out (step 1042). The Job ends after the above operation is performed for the final wafer (step 1044).

Table 3 shows a relationship between the offsets in the embodiment shown in FIG. 9:

TABLE 3

|  | CONSTANT DURING SCANNING | SCAN SYNCHRONIZED CONT. |
|---|---|---|
| FIRST CORRECTOR | OFFSET 2 (or 2 + 10) | — |
| SECOND CORRECTOR | OFFSET 3 + 6(n) | — |
| LASER EXPOSURE DOSE CONTROL | OFFSET 4 + 7(n) | OFFSET 1 + 5(n) |

TABLE 2

|  | CD CORRECTION IN SCAN. DIREC. | LASER EXPO. DOSE CONT. | SWITCHING OF CORRECTION | OFFSET |
|---|---|---|---|---|
| FAC. 1 | COMMON TO SHOTS | (HIGH ORDER) | INTRINSIC TO RETICLE | 1, 4 |
| FACs. 2–6 | INTRINSIC TO EACH SHOT | (GRADIENT, CONSTANT) | INTRINSIC TO JOB | 5(n): GRAD., 7(n): CONST. |

The offsets 5 to 7 are set in the exposure apparatus (steps 1026, 1028). Assume that N is the number of shots on the wafer. Then, for example, N offsets, i.e., offsets 5(1) to offset 5(N), are stored.

Figure 12:
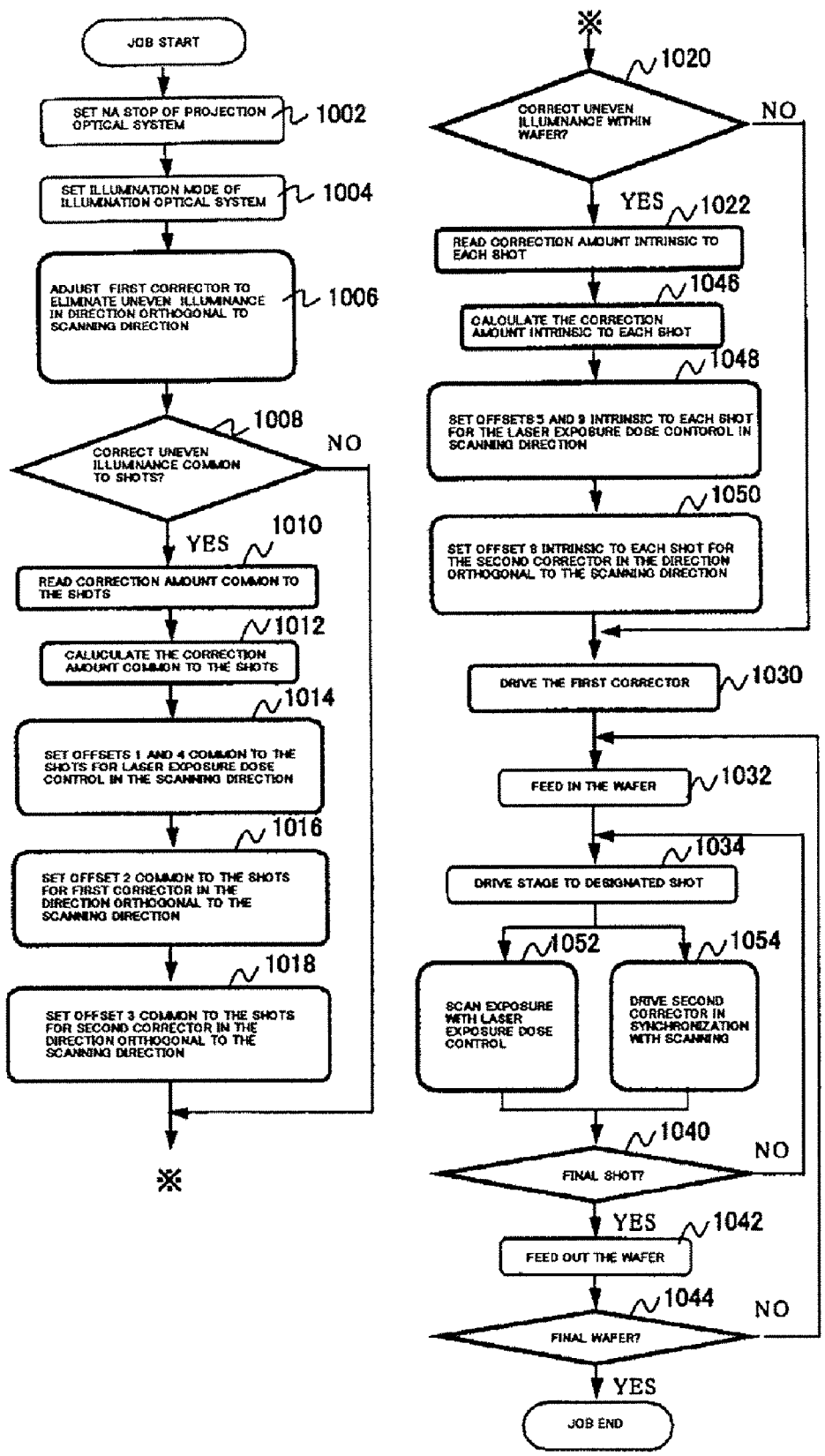
FIG. 12 is a flowchart for explaining a UI correction method according to a second embodiment of the present invention.

Next, the corrector 150 is driven into a predetermined shape (step 1030). The corrector 150 drives a slit width by the offset 2. Next, the wafer 40 is fed in (step 1032). Next, the stages 210 and 410 are driven so that the designated shot or Referring now to FIG. 12, a description will be given of a correction method of a second embodiment. Those steps in FIG. 12, which are the same as those in FIG. 9, are designated by the same reference numerals, and a description thereof will be omitted. The correction method shown in FIG. 12 is different from that in FIG. 9 in having the steps of 1046 to 1054. Instead of the steps 1024-1028, FIG. 12 includes the steps 1046-1050 subsequent to the step 1022.

Figure 13:
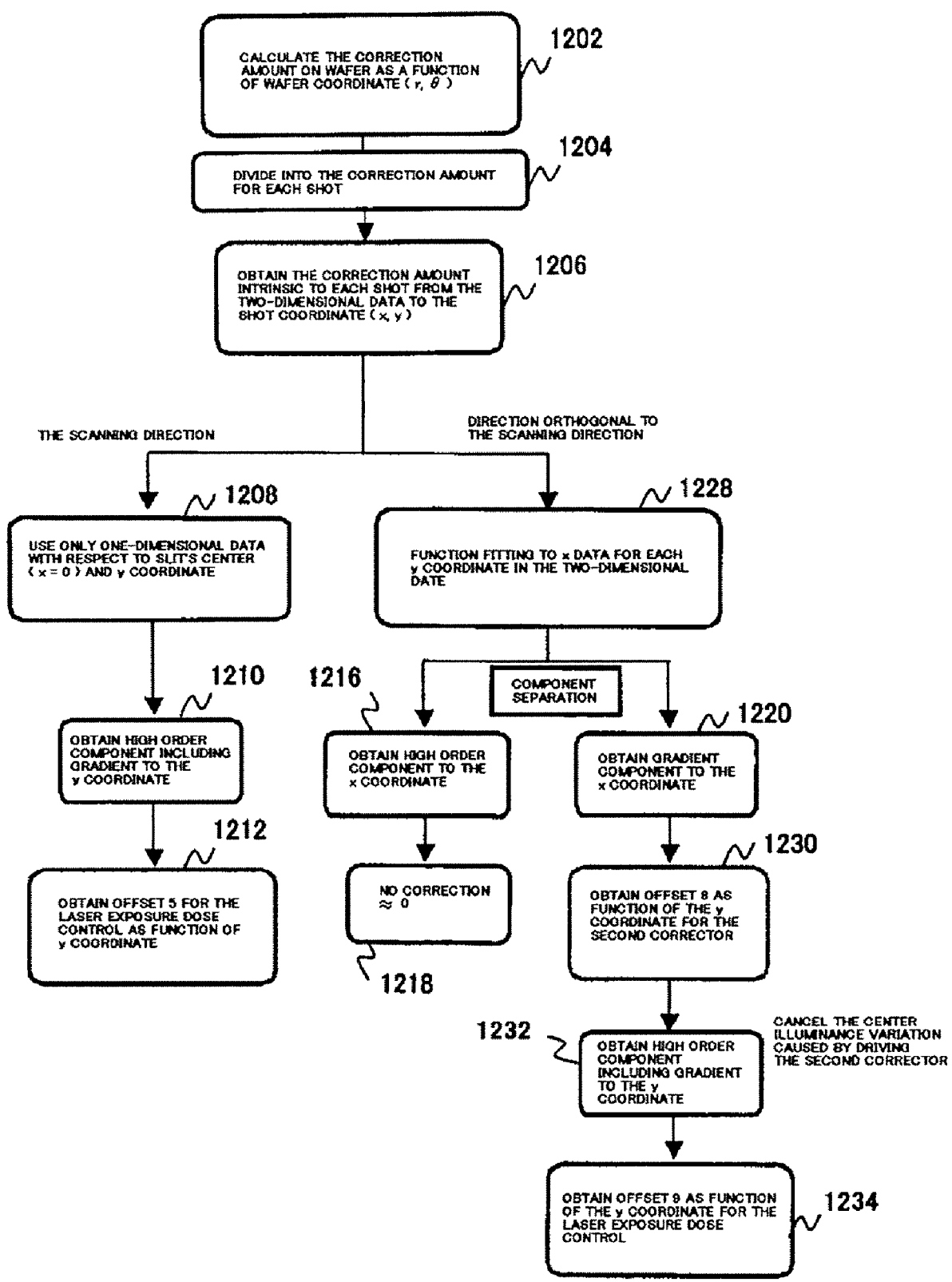
FIG. 13 is a flowchart for explaining a method for calculating correction amounts intrinsic to each shot shown in FIG. 9.

Referring to FIG. 13, a description will be given of a method of calculating a correction amount intrinsic to each shot (step 1046). Those steps in FIG. 13, which are the same as those in FIG. 11, are designated by the same reference numerals, and a description thereof will be omitted. The stages are driven so that the designated shot or n-th shot comes to the exposure position. The illuminance correction amount is calculated as an offset 8(n). First, as to a direction orthogonal to the scanning direction, a function is fitted to the two-dimensional data expressed by the in-shot coordinate (x, y) for X data for each Y coordinate (step 1228). Next, a gradient in the X direction is obtained for each Y coordinate using the least squares method, etc. (step 1220). The offset 8(n) is obtained for the second corrector 160 as a function of the y coordinate (step 1230). The offset 9(n) is determined as a variation amount of the accumulated illuminance of the slit center, which occurs when the offset 8(n) is set to a driving amount of the corrector 160 (step 1234). The offset 9(n) is determined from a high-order continuous function including a gradient component to the y coordinate (step 1232), and used for the laser exposure dose control.

Tables 4 and 5 show a relationship between the correctors and the offsets 1-9:

TABLE 4

| | CD CORR. IN | | | SWITCHING | OFFSET | |
|---|---|---|---|---|---|---|
| | SLIT'S LONG DIRECTION | 1ST CORR. | 2ND CORR. | OF CORRECTION | 1ST CORR. | 2ND CORR. |
| FACs. A-C | COMMON TO SHOTS | (HIGH ORDER) | — | INTRINSIC TO JOB | 10 | — |
| FAC. 1 | COMMON TO SHOTS | (HIGH ORDER) | (GRAD.) | INTRINSIC TO RETICLE | 2 | 3 |
| FACs. 2-6 | INTRINSIC TO EACH SHOT | — | (GRAD.) | INTRINSIC TO JOB | + | 8(n) |

TABLE 5

| | CD CORRECTION IN SCANNING DIRECTION | LASER EXPO. DOSE CONT. | SWITCHING OF CORRECTION | OFFSET |
|---|---|---|---|---|
| FACTOR 1 | COMMON TO SHOTS | (HIGH ORDER) | INTRINSIC TO RETICLE | 1, 4 |
| FACs. 2–6 | INTRINSIC TO EACH SHOT | (GRADIENT, CONSTANT) | INTRINSIC TO JOB | 5(n): GRAD., 9(n): CONST. |

The offsets 5, 8, and 9 are set in the exposure apparatus (steps 1048, 1050). Assume that N is the number of shots on the wafer. Then, for example, N offsets, i.e., offsets 5(1) to offset 5(N), are stored.

Two types of offsets, i.e., the offset 3 common to the shots and the offset 8(n) intrinsic to each shot, are set to the corrector 160 for driving. The corrector 160 uses, for corrective driving, by the amount of the offset 3 added to the offset 8(n) expressed by the y coordinate as the scanning direction in synchronization with scanning (step 1054). In the scan exposure, the laser exposure dose is controlled in synchronization with scanning while the following items are considered (step 1052). First, the offset common to the shots is set to a uniform correction amount during scanning. In addition, the offset 1 common to the shots is added to the offsets 5(n) and 9(n) intrinsic to each shot for the correction amount to be controlled in synchronization with scanning during scanning.

Table 6 shows a relationship between the offsets and the control in synchronization with scanning in the embodiment shown in FIG. 12:

TABLE 6

| | CONSTANT DURING SCAN. | SCAN SYNC. CONTROL |
|---|---|---|
| FIRST CORRECTOR | OFFSET 2 (or 2 + 10) | — |
| SECOND CORRECTOR | OFFSET 3 + 6(n) | OFFSET 8(n) |
| LASER EXPO. DOSE CONT. | OFFSET 4 + 7(n) | OFFSET 1 + 5(n) + 9(n) |

The embodiments shown in FIGS. 9 and 12 adjust the accumulated uneven illuminance in the slit's longitudinal direction caused by the factors A-C in executing Job. With a sufficiently small variation with time of the factors A and B, the exposure apparatus can previously store the offset 10 corresponding to the factor C in the Job for the slit-width adjusting position for the corrector 150, which provides a uniform accumulated illuminance in the initial state of the corrector 160. The offset 10 is set for each of plural conditions, when the Job uses plural factors C. For example, offset 101 to 110 are set for the factors C1 to C140.

In executing the Job to which the factor C5 is set, the offset 105 corresponding to the factor C5 is read out, and the corrector 150 drives a slit width by the amount of the offset 105 added to the offset 2 shown in Tables 3 and 4. The offset 10 is reset within a permissible time period that can ignore an error amount due to the variation with time, for example, every three months. Thereby, a time period necessary for the Job execution is shortened and the operation time of the exposure apparatus improves.

Figure 14:
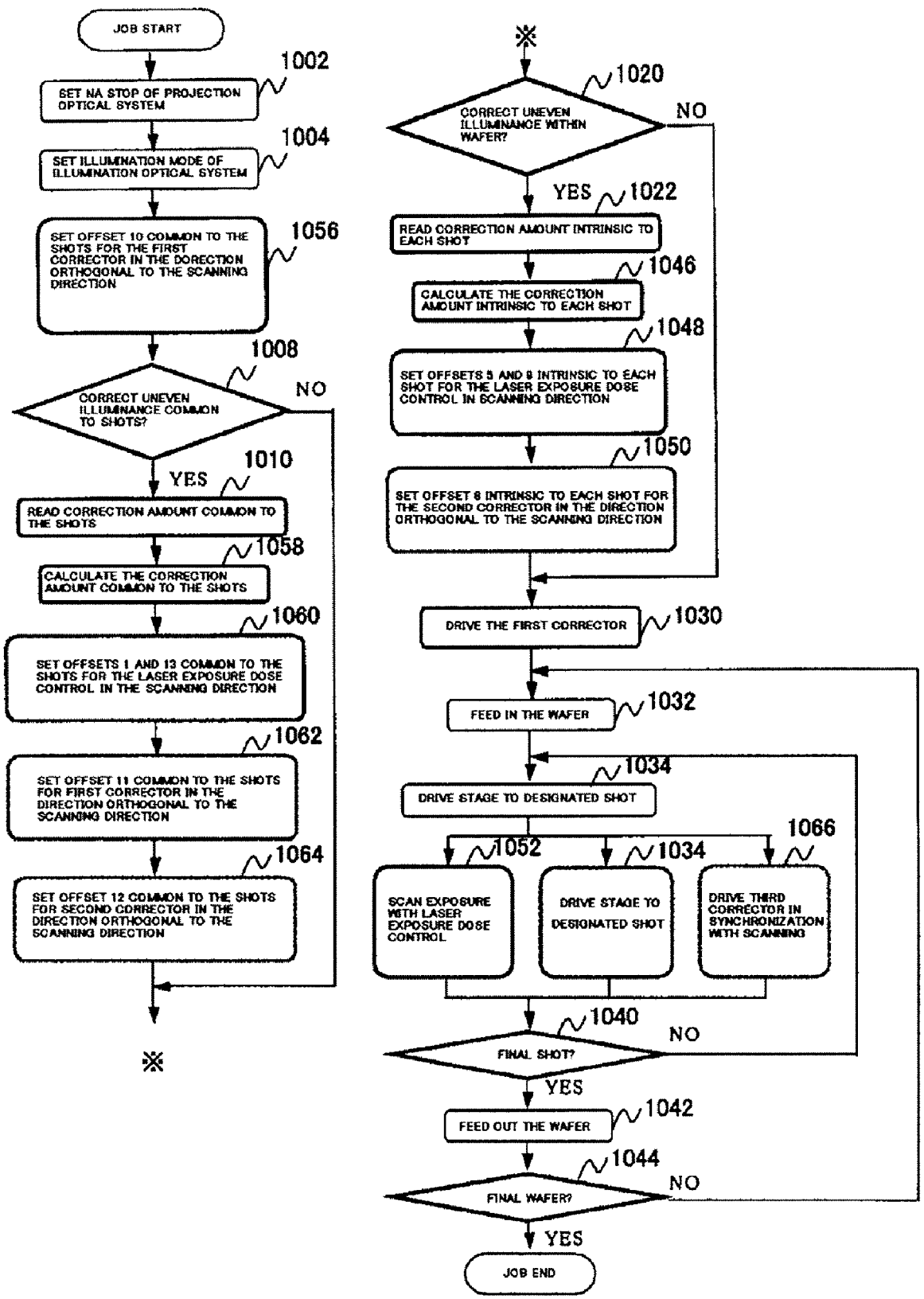
FIG. 14 is a flowchart for explaining a UI correction method according to a third embodiment of the present invention.

Referring now to FIG. 14, a description will be given of a correction method according to a third embodiment. Those steps in FIG. 14, which are the same as those in FIG. 9, are designated by the same reference numerals, and a description thereof will be omitted. The correction method shown in FIG. 14 is different from that in FIG. 9 in having the steps of 1046 to 1066. Instead of the steps 1024-1028, FIG. 14 includes the steps 1046-1050 subsequent to the step 1022. This embodiment provides a third UI corrector 170, uses the above offset 10 (step 1056), and associates driving of the correctors 160 and 170 with scanning (steps 1054 and 1066).

Figure 15:
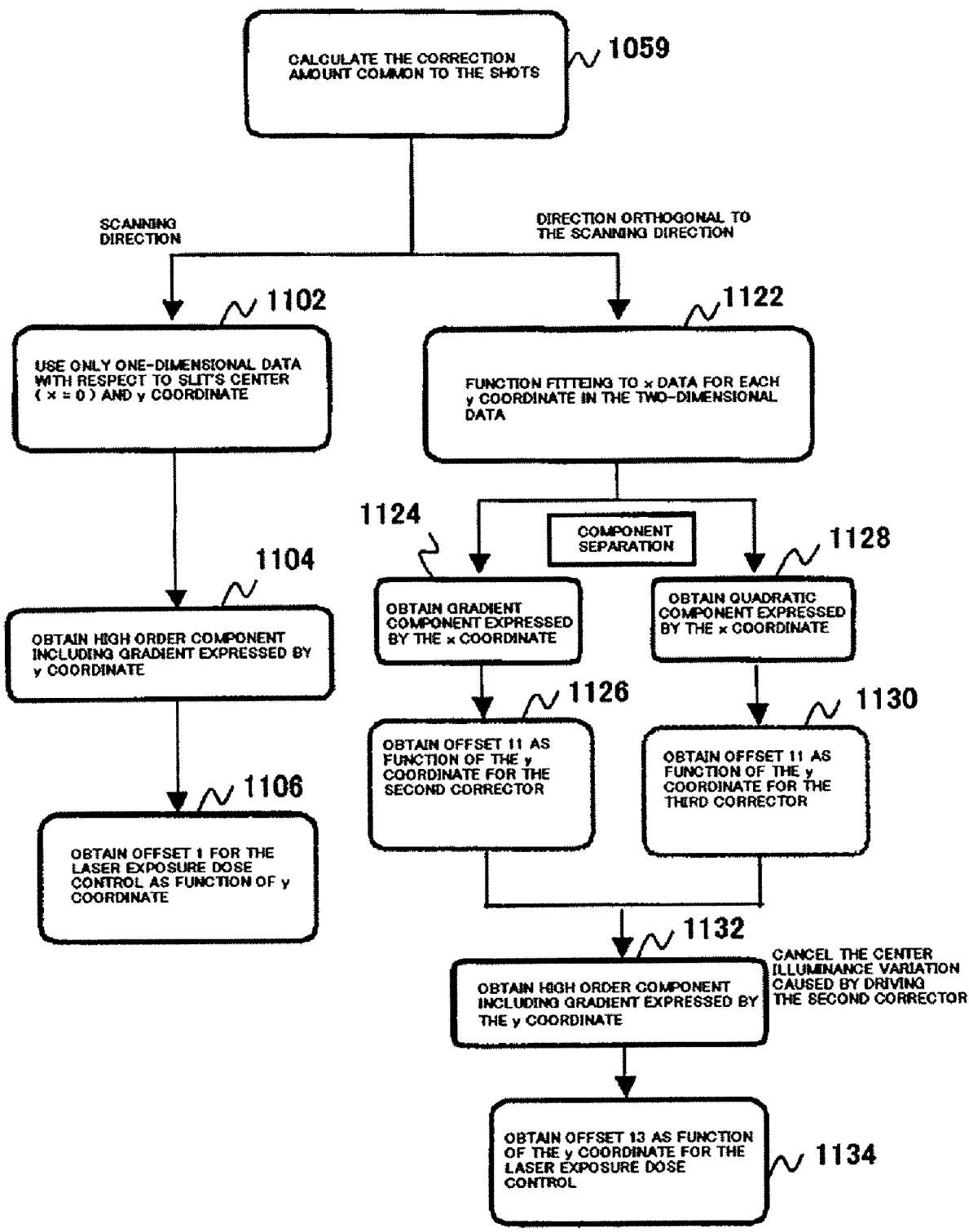
FIG. 15 is a flowchart for explaining a method for calculating correction amounts common to the shots shown in FIG. 14.

Referring now to FIG. 15, a description will be given of the calculation method (step 1058) of a correction amount common to the shots in this embodiment. Those steps in FIG. 15, which are the same as those in FIG. 10, are designated by the same reference numerals, and a description thereof will be omitted.

The illuminance correction amounts in the direction orthogonal to the scanning direction is calculated as offsets 11 and 12. First, a quadratic function is fitted to one-dimensional data in the x direction every y coordinate so as to minimize an error (step 1122). The one-dimensional data is obtained from the two-dimensional data of the in-shot coordinate (x, y). A gradient in the x direction every y coordinate is obtained (step 1124), and set as the offset 11 (step 1126). The quadratic function component in the x direction is obtained (step 1128), and set as the offset 12 (step 1230). An offset 13 is determined as a variation amount of the accumulated illuminance of the slit center, which occurs when the offset 11 is set to a driving amount of the corrector 160 and the offset 12 is set to a driving amount of the corrector 170 (step 1234). The offset 13 is determined as a high-order continuous function including a gradient component to the y coordinate (step 1132), and used for the laser exposure dose control.

Tables 7 and 8 each shows a relationship between the correctors and the offsets 1, 5, and 8-13.

corrector 170 also provides a correction amount of the offset 12 expressed by the y coordinate as the scanning direction, in synchronization with scanning. In scan exposure, the laser exposure dose is controlled in synchronization with scanning while the following is considered (step 1052). The offsets 1 and 13 common to the shots are added to the offsets 5(n) and 9(n) intrinsic to each shot and set to a correction amount to be controlled in synchronization with scanning during scanning.

Table 9 shows a relationship between the offsets and the control in synchronization with scanning in the embodiment shown in FIG. 14:

TABLE 9

|  | CONSTANT DURING SCAN. | SCAN SYNC. CONTROL |
|---|---|---|
| FIRST CORRECTOR | OFFSET 10 | — |
| SECOND CORRECTOR | — | OFFSET 8(n) + 11 |
| THIRD CORRECTOR | — | OFFSET 12 |
| LASER EXPO. DOSE CONT. | — | OFFSET 1 + 5(n) + 9(n) + 13 |

The above embodiments read data an exposure result of the pilot wafer using an external apparatus, and set the data as the CD errors caused by the factors 2 to 6 to the exposure apparatus. Of course, the pilot wafer may be directly fed in the exposure apparatus to automatically read a CD error using a

TABLE 7

| | CD CORR. | | | | | OFFSET | | |
|---|---|---|---|---|---|---|---|---|
| | IN SLIT'S LONG DIRE. | 1ST CORR. | 2ND CORR. | 3RD CORR. | SWITCH. OF CORR. | 1ST CORR. | 2ND CORR. | 3RD CORR. |
| FACs. A-C | COMMON TO SHOTS | (HIGH ORDER) | — | — | INTRINS. TO JOB | 10 | — | — |
| FACT. 1 | COMMON TO SHOTS | — | (GRAD.) | (2ND ORDER) | INTRINS. TO RTCL | — | 11 | 12 |
| FACs. 2-6 | INTRIN. TO EACH SHOT | — | (GRAD.) | — | INTRINS. TO JOB | — | 8(n) | — |

TABLE 8

| | CD CORR. IN SCAN. DIREC. | LASER EXPO. DOSE CONTROL | SWITCHING OF CORRECTION | OFFSET |
|---|---|---|---|---|
| FAC. 1 | COMMON TO SHOTS | (HIGH ORDER) | INTRINSIC TO RETICLE | 1, 13 |
| FACs. 2-6 | INTRINSIC TO EACH SHOT | (GRADIENT, CONSTANT) | INTRINSIC TO JOB | 5(n): GRAD., 9(n): CONST. |

The offsets 1, 11-13 are set in the exposure apparatus (steps 1060 to 1064) The offset 10 that is previously set in the exposure apparatus is set to the corrector 150 (step 1056). Next, the stages are driven so that the designated shot or n-th shot comes to the exposure position (step 1034). The offset 10 common to the shots is set to drive the corrector 150. The two types of offsets, i.e., the offset 11 common to the shots and the offset 8(n) intrinsic to each shot, are set so as to drive the corrector 160 (step 1054). Only the offset 12 common to the shots is set so as to drive the corrector 170 (step 1066). The corrector 150 provides a correction amount of the offset 10. The corrector 160 provides a correction amount of the offset 3 added to the offset 11 expressed by the y coordinate as the scanning direction in synchronization with scanning. The microscope etc. in the exposure apparatus, and the CD error may be used for data for the CD correction.

The above embodiments use inspection data of a reticle or two-dimensional data expressed by the in-shot coordinate (x, y) for CD error correction data common to the shots, but may obtain data from the data of the exposed pilot wafer. In this case, in FIGS. 11 and 13, an average of the number of shots N of the same coordinate in the shots is calculated using the two-dimensional data of the in-shot coordinate (x, y) for each shot. Average data of each shot or the two-dimensional data expressed by the in-shot coordinate (x, y) are treated as correction amounts common to the shots, and the offsets 1 to 4 are determined. A user may directly input the offsets 1 to 13 from a console.

Figure 16:
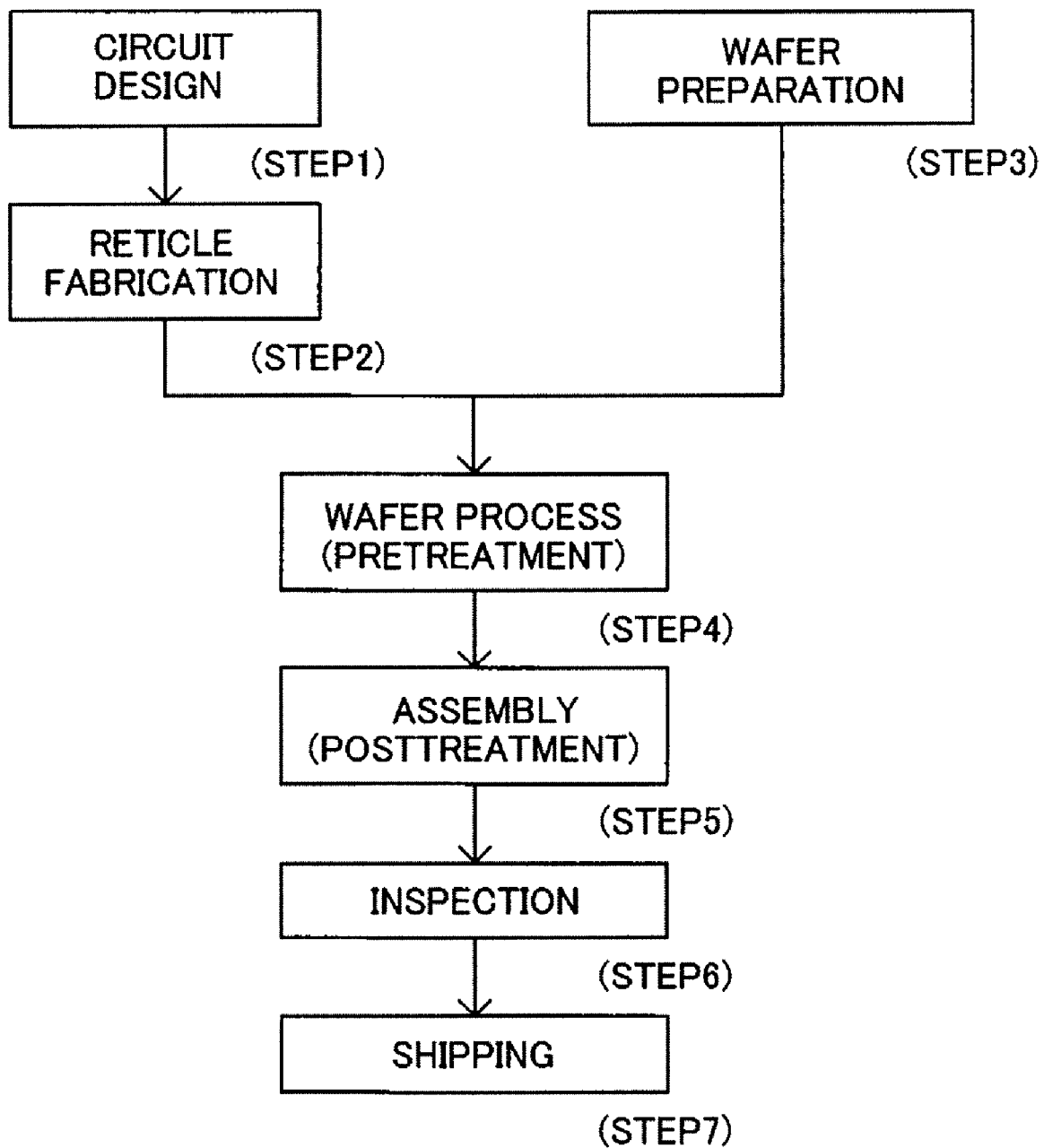
FIG. 16 is a flowchart for explaining a manufacture of a device, such as a semiconductor chip (e.g., an IC and an LSI), an LCD, and a CCD.
Figure 17:
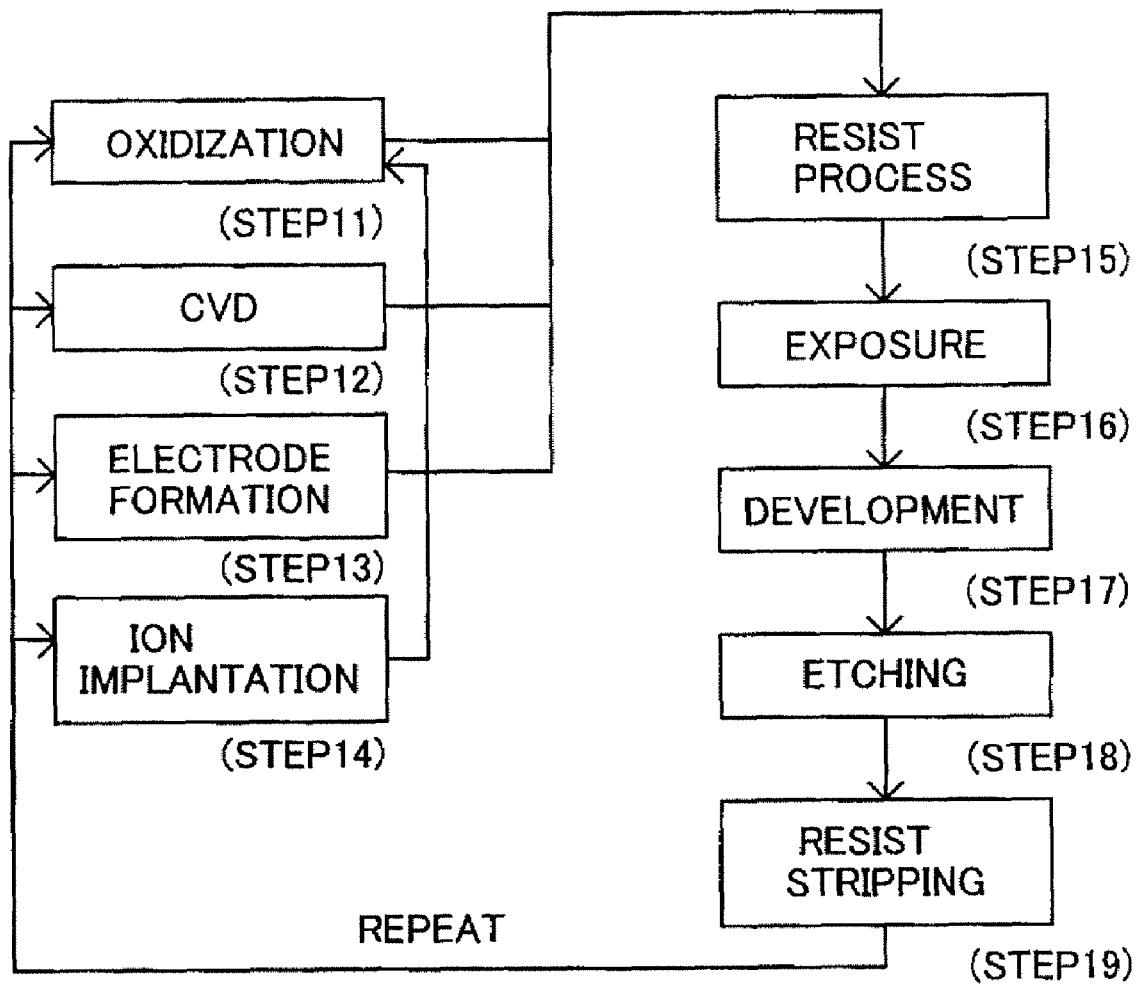
FIG. 17 is a flowchart of a detailed wafer process of step 4 shown in FIG. 16.

Referring now to FIGS. 16 and 17, a description will be given of an embodiment of a device manufacturing method using the exposure apparatus. FIG. 16 is a flowchart for explaining a fabrication of devices. Here, a description will be given of a fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 17 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus 100 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever. Thus, the device manufacturing method that uses the exposure apparatus 100, and its resultant products also constitute one aspect of the present invention.

Furthermore, the present invention is not limited to these preferred embodiments and various variations and modifications may be made without departing from the scope of the present invention.

This application claims a foreign priority benefit based on Japanese Patent Application No. 2005-354543, filed on Dec. 8, 2005, which is hereby incorporated by reference herein in its entirety as if fully set forth herein.

What is claimed is:

1. An exposure method comprising the steps of:
    exposing a pattern of a reticle onto a substrate by scanning the reticle and the substrate, and by illuminating an illumination area having a slit shape on the reticle using a light from a light source, the slit shape having a longitudinal direction corresponding to a direction perpendicular to a scanning direction; and
    correcting an accumulated illuminance in the scanning direction at each position of the illumination area in the longitudinal direction,
    wherein said correcting step includes the steps of:
    calculating a first illuminance correction amount common to a plurality of areas on the substrate, the pattern being transferred to each area;
    calculating a second illuminance correction amount intrinsic to each area; and
    setting a correction amount of the accumulated illuminance in the each area by adding the first illuminance correction amount to the second illuminance correction amount.

2. An exposure method according to claim 1, wherein the first correction amount calculating method includes the steps of:
    converting two-dimensional data expressed by a coordinate in the area into one-dimensional data expressed by a coordinate along the longitudinal direction;
    obtaining a high order component expressed by the coordinate along the longitudinal direction; and
    obtaining the first correction amount that is maintained constant during scanning irrespective of a coordinate in the scanning direction, said correcting step setting the first correction amount to a first corrector that includes a pair of blades arranged on a plane optically conjugate relationship with the reticle such that an interval between the blades can be adjusted in a direction corresponding to the scanning direction.

3. An exposure method according to claim 1, wherein the first correction amount calculating method includes the step of obtaining a gradient component expressed by a coordinate along the longitudinal direction from two-dimensional data expressed by a coordinate in the area, said correcting step setting the first correction amount to a second corrector arranged on a plane that has an optically conjugate or Fourier transformation relationship with the reticle, the second corrector being configured linearly movable in the longitudinal direction or rotatable around one axis that is parallel to a direction corresponding to the scanning direction.

4. An exposure method according to claim 1, wherein the second correction amount calculating method includes the step of obtaining a gradient component expressed by a coordinate along the longitudinal direction from two-dimensional data expressed by a coordinate in the area, said correcting step setting the second correction amount to a second corrector arranged on a plane that has an optically conjugate or Fourier transformation relationship with the reticle, the second corrector being configured linearly movable in the longitudinal direction or rotatable around one axis that is parallel to a direction corresponding to the scanning direction.

5. An exposure method according to claim 1, wherein the first correction amount calculating method includes the step of obtaining a high order component expressed by a coordinate along the longitudinal direction from two-dimensional data expressed by a coordinate in the area, said correcting step setting the first correction amount to a third corrector arranged on a plane that has an optically conjugate or Fourier transformation relationship with the reticle, the third corrector being configured linearly movable in the longitudinal direction or rotatable around one axis that is parallel to a direction corresponding to the scanning direction.

6. An exposure method according to claim 1, wherein at least one of the first and second correction amounts is maintained constant irrespective of a coordinate along the scanning direction.

7. An exposure method according to claim 1, wherein at least one of the first and second correction amounts is expressed by a function of a coordinate along the scanning direction, and said exposure method further comprises the step of controlling the at least one in synchronization with scanning.

8. An exposure method according to claim 1, further comprising the step of correcting a laser exposure dose, which step includes the steps of:
    calculating a third illuminance correction amount common to the plurality of areas on the substrate; and
    calculating a fourth illuminance correction amount intrinsic to each area, said laser exposure dose correcting step correcting the laser exposure dose based on the third and fourth illuminance correction amounts.

9. An exposure method according to claim 8, wherein the third illuminance correction amount calculating step includes the steps of:

obtaining a high order component including a gradient component expressed by a coordinate along the scanning direction from two-dimensional data expressed by a coordinate in the area so as to set a component of the third illuminance correction amount in the scanning direction as a function of the coordinate along the scanning direction; and setting a component of the third illuminance correction amount in the longitudinal direction by canceling out an illuminance variation caused by the first illuminance correction amount.

10. An exposure method according to claim 8, wherein the fourth illuminance correction amount calculating step includes the steps of:

obtaining a gradient component expressed by a coordinate along the scanning direction from two-dimensional data expressed by a coordinate in the area so as to set a component of the fourth illuminance correction amount in the scanning direction as a function of the coordinate along the scanning direction; and setting a component of the fourth illuminance correction amount in the longitudinal direction by canceling out an illuminance variation caused by the second illuminance correction amount.

* * * * *